United States Patent
Fukuda et al.

(10) Patent No.: US 9,625,821 B2
(45) Date of Patent: Apr. 18, 2017

(54) DEVELOPING APPARATUS

(71) Applicant: TOKYO ELECTRON LIMITED, Tokyo (JP)

(72) Inventors: Masahiro Fukuda, Koshi (JP); Taro Yamamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/801,096

(22) Filed: Jul. 16, 2015

(65) Prior Publication Data

US 2016/0026086 A1 Jan. 28, 2016

(30) Foreign Application Priority Data

Jul. 23, 2014 (JP) .................. 2014-150169
May 13, 2015 (JP) .................. 2015-098358

(51) Int. Cl.
*G03B 27/42* (2006.01)
*G03F 7/30* (2006.01)

(52) U.S. Cl.
CPC ...................... *G03F 7/30* (2013.01)

(58) Field of Classification Search
CPC ........... H01L 21/67051; H01L 21/6708; H01L 21/6715; H01L 21/67017; H01L 21/6719; H01L 21/02019; H01L 21/02052; H01L 21/0276; H01L 21/288; H01L 21/67057; H01L 21/67086; H01L 21/67225; H01L 21/67276; H01L 21/02054; H01L 21/02282; H01L 21/3105

See application file for complete search history.

(56) References Cited

U.S. PATENT DOCUMENTS

| | | | |
|---|---|---|---|
| 5,250,114 A * | 10/1993 | Konishi | H01L 21/6715 118/321 |
| 5,960,225 A * | 9/1999 | Fujimoto | G03F 7/162 396/611 |
| 6,444,029 B1 * | 9/2002 | Kimura | B05C 11/08 118/321 |
| 2008/0013946 A1 * | 1/2008 | Ono | G03D 5/00 396/578 |

FOREIGN PATENT DOCUMENTS

JP 4893799 B2 3/2012
JP 2012-74589 A 4/2012

* cited by examiner

*Primary Examiner* — Mesfin Asfaw
(74) *Attorney, Agent, or Firm* — Nath, Goldberg & Meyer; Jerald L. Meyer

(57) ABSTRACT

A developing apparatus includes a first cup module and a second cup module arranged to be spaced apart from each other in a transverse direction; a first developing solution nozzle configured to wait in a standby position between the first cup module and the second cup module; and a first moving mechanism configured to move the first developing solution nozzle between the standby position and a processing position in which the developing solution is supplied to the substrate, wherein the first developing solution nozzle includes an ejection hole configured to eject the developing solution to form a liquid puddle on a surface of the substrate, the first developing solution nozzle includes a contact portion formed smaller than the surface of the substrate and installed to face the surface of the substrate, and the first developing solution nozzle spreads the liquid puddle on the substrate.

19 Claims, 29 Drawing Sheets

DEVELOPING APPARATUS

CROSS-REFERENCE TO RELATED APPLICATIONS

This application claims the benefit of Japanese Patent Application No. 2014-150169, filed on Jul. 23, 2014, and Japanese Patent Application No. 2015-098358, filed on May 13, 2015, in the Japan Patent Office, the disclosures of which are incorporated herein in their entirety by reference.

TECHNICAL FIELD

The present disclosure relates to a developing apparatus which develops a light-exposed substrate by supplying a developing solution to the exposed substrate.

BACKGROUND

In a photolithography process for the manufacture of a semiconductor device, a resist film is formed and a developing solution is supplied to a substrate exposed to light along a predetermined pattern, whereby a resist pattern is formed. For example, a developing process is conducted by supplying a developing solution from a nozzle while rotating a substrate, and moving a supply position of the developing solution on the radius of the substrate. In this method, by the movement of the supply position of the developing solution and the action of a centrifugal force, a liquid film of the developing solution is formed on the substrate and the developing solution forming the liquid film flows.

The developing solution supplied onto the substrate flows along a surface of the resist film while being spread by the centrifugal force. When the developing solution flows in this way, the developing solution reacts with a resist and the concentration of the developing solution is changed. Thus, there is a problem that the reaction condition of the resist film and the developing solution varies in the flow direction of the developing solution. As a result, it is likely that a critical dimension (CD), which is a line width of a pattern within one in-plane exposure portion (shot), is changed and the critical dimension uniformity (CDU) deteriorates.

Furthermore, there is a technique of bringing a lower end portion of a nozzle disposed above a central portion of a substrate into contact with a processing solution supplied from the nozzle, rotating the substrate, and forming a liquid film on the substrate. However, this technique is not capable of solving the aforementioned problem.

SUMMARY

Some embodiments of the present disclosure provide a technique capable of, when performing a developing process with respect to an exposed substrate, improving the line width uniformity of a resist pattern within a plane of a substrate and suppressing the increase in the size of an apparatus.

According to one embodiment of the present disclosure, there is provided a developing apparatus which is provided with a cup module including a substrate holding part configured to be rotated by a rotating mechanism and a liquid receiving cup surrounding the substrate holding part, and which performs development by supplying a developing solution to a substrate held on the substrate holding part. The apparatus includes a first cup module and a second cup module arranged to be spaced apart from each other in a transverse direction; a first developing solution nozzle configured to wait in a standby position between the first cup module and the second cup module; and a first moving mechanism configured to move the first developing solution nozzle between the standby position and a processing position in which the developing solution is supplied to the substrate, wherein the first developing solution nozzle includes an ejection hole configured to eject the developing solution to form a liquid puddle on a surface of the substrate. The first developing solution nozzle includes a contact portion formed smaller than the surface of the substrate and installed to face the surface of the substrate, and the first developing solution nozzle moves, together with a supply position of the developing solution, from one of a central portion and a peripheral edge portion of a rotating substrate to the other of the central portion and the peripheral edge portion in a state in which the contact portion makes contact with the liquid puddle, whereby the first developing solution nozzle spreads the liquid puddle on the substrate.

According to another embodiment of the present disclosure, there is provided a developing apparatus which is provided with a cup module including a substrate holding part configured to be rotated by a rotating mechanism and a liquid receiving cup surrounding the substrate holding part, and which performs development by supplying a developing solution to a substrate held on the substrate holding part. The apparatus includes a first cup module and a second cup module arranged to be spaced apart from each other in a transverse direction; a first developing solution nozzle configured to wait in a first standby position and configured to supply the developing solution onto the substrate; a second developing solution nozzle configured to wait in a second standby position which overlaps with the first standby position in an up-down direction; a first moving mechanism configured to move the first developing solution nozzle between the first standby position and a processing position in which the developing solution is supplied to the substrate; and a second moving mechanism configured to move the second developing solution nozzle between the second standby position and a processing position in which the developing solution is supplied to the substrate, wherein the first developing solution nozzle includes an ejection hole configured to eject the developing solution to form a liquid puddle on a surface of the substrate. The first developing solution nozzle includes a contact portion formed smaller than the surface of the substrate and installed to face the surface of the substrate, and the first developing solution nozzle moves, together with a supply position of the developing solution, from one of a central portion and a peripheral edge portion of a rotating substrate to the other of the central portion and the peripheral edge portion in a state that the contact portion makes contact with the liquid puddle, whereby the first developing solution nozzle spreads the liquid puddle on the substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
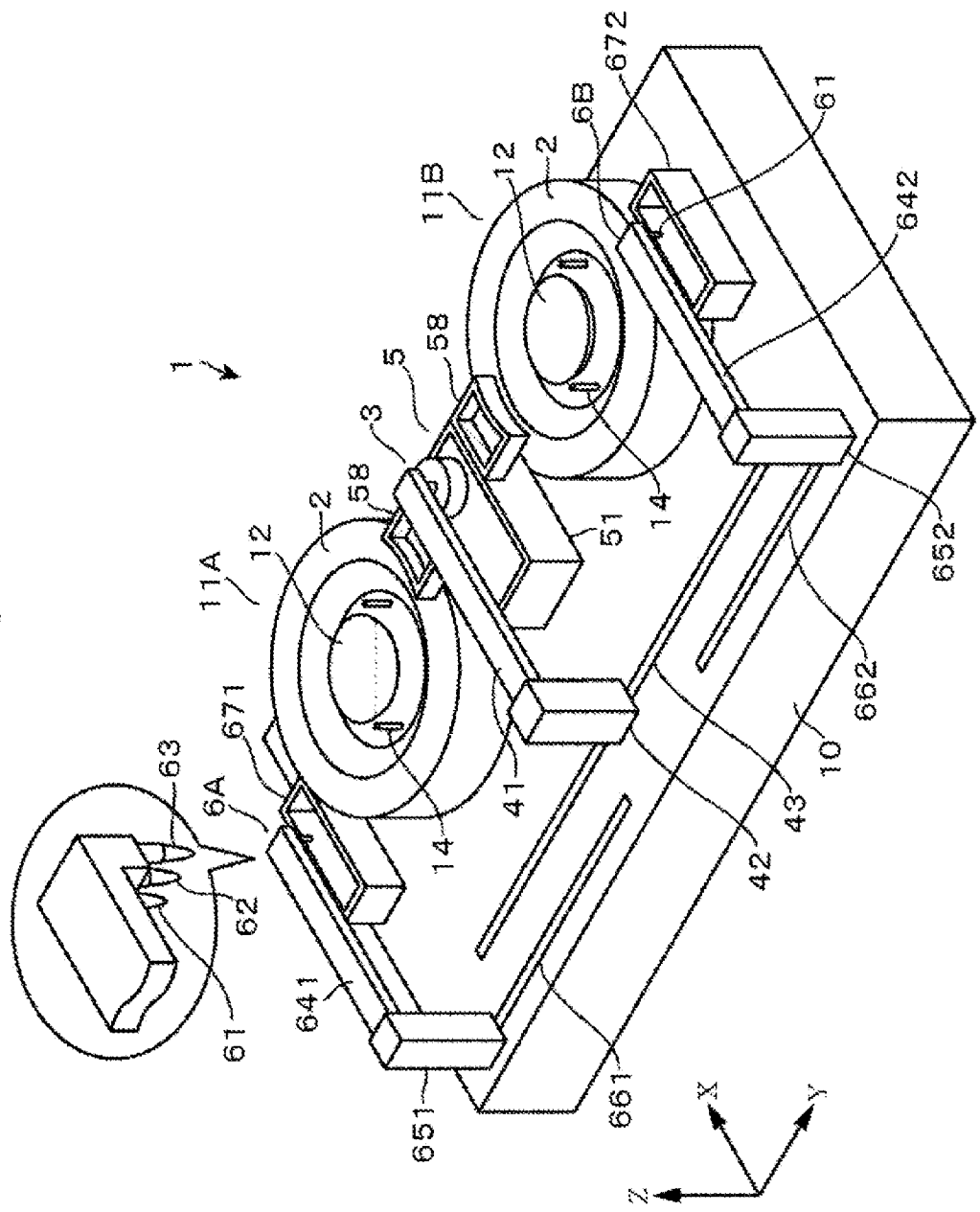
FIG. 1 is a perspective view of a developing apparatus according to a first embodiment of the present disclosure.

Hereinafter, some embodiments of the present disclosure will be described with reference to the accompanying drawings. Throughout the drawings, like reference numerals are used to designate like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 2:
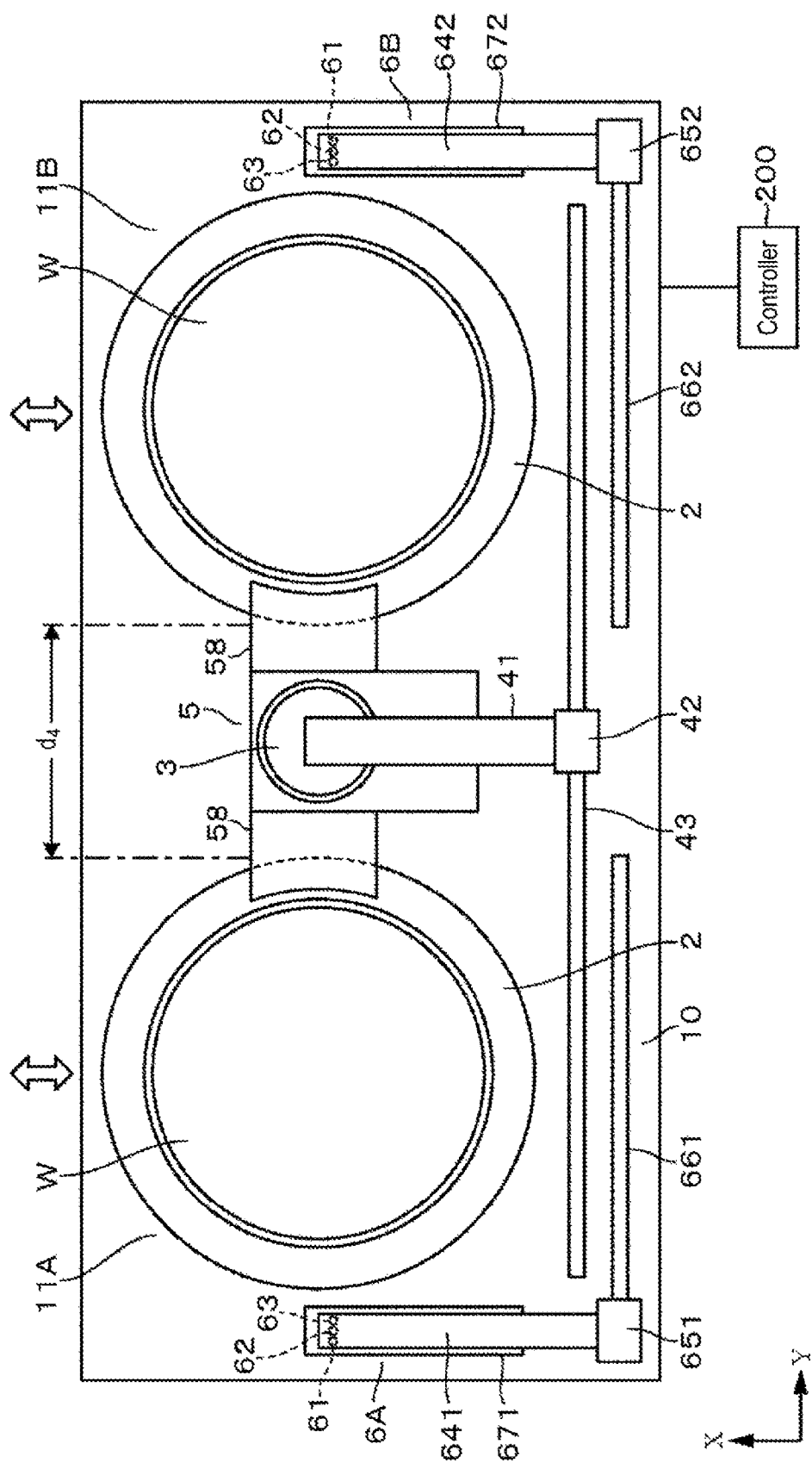
FIG. 2 is a plan view of the developing apparatus.

FIGS. 1 and 2 illustrate a developing apparatus 1 according to a first embodiment of the present disclosure. For example, the developing apparatus 1 is installed within a coating and developing apparatus which includes a plurality of modules for performing a resist solution coating process and a developing process with respect to a semiconductor wafer (hereinafter referred to as a "wafer") W which is a substrate. The developing apparatus 1 includes a plurality of, e.g., two cup modules 11A and 11B, a first developing solution nozzle 3 and a second developing solution nozzle 61. The two cup modules 11A and 11B are installed on a base member 10 so that the cup modules 11A and 11B are arranged to be spaced apart from each other in a transverse direction (in a Y-axis direction in FIGS. 1 and 2). In this example, the cup module existing at the left side in FIGS. 1 and 2 will be described as a first cup module 11A and the cup module existing at the right side will be described as a second cup module 11B.

Figure 3:
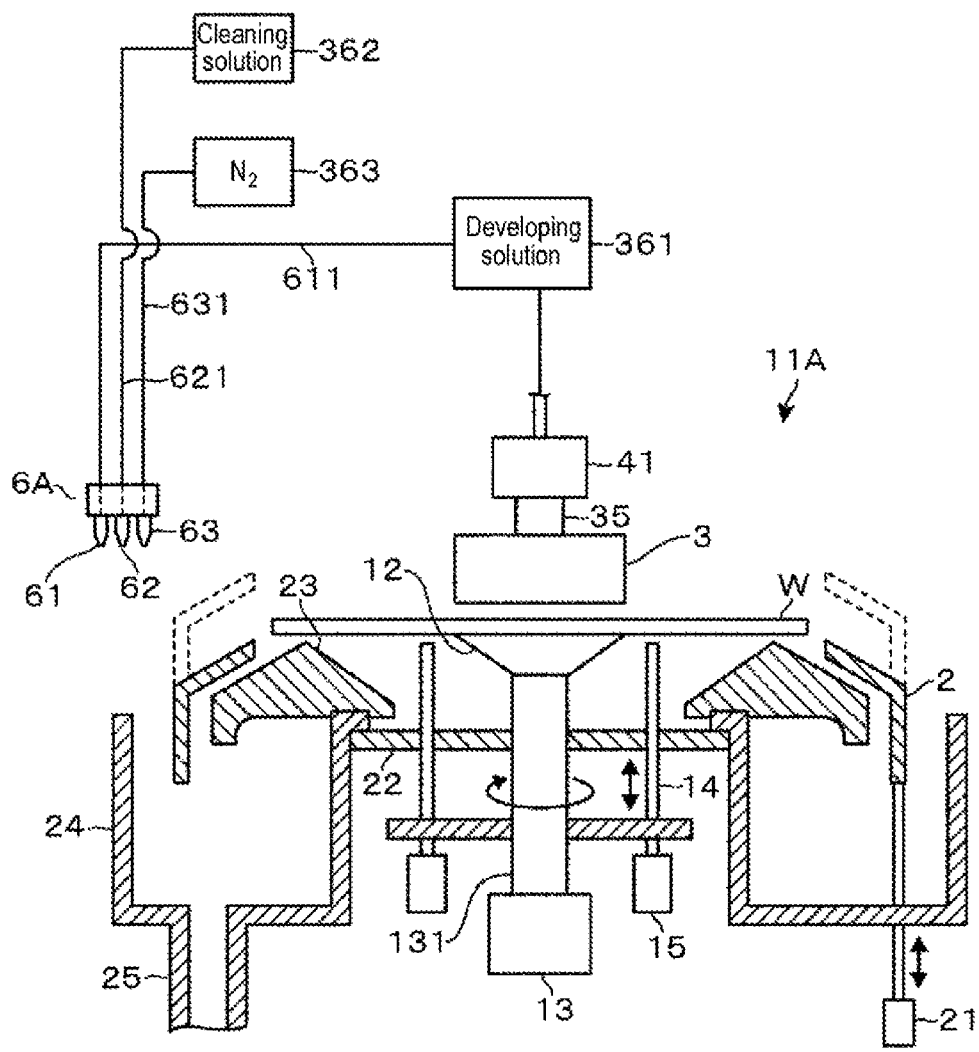
FIG. 3 is a vertical sectional side view of a first cup module installed in the developing apparatus.

Since the first and second cup modules 11A and 11B are identically configured, the first cup module 11A will be described as an example with reference to FIGS. 1 to 3. The cup module 11A includes a spin chuck 12 which is a substrate holding part. The spin chuck 12 absorbs a central portion of a rear surface of a wafer W and horizontally holds the wafer W. The spin chuck 12 can be rotated about a vertical axis by a rotating mechanism 13 through a rotation shaft 131. A liquid receiving cup 2 is installed in the cup module 11A so as to surround the wafer W held on the spin chuck 12. The cup 2 has an approximately cylindrical shape with the upper side inclined inward. The cup 2 can be moved up and down by a lift mechanism 21 between a delivery position (a position indicated by solid lines in FIG. 3) where the wafer W is delivered to or from the spin chuck 12 and a processing position (a position indicated by dot lines in FIG. 3) where the wafer W is subjected to a developing process.

A circular plate 22 is installed below the wafer W held on the spin chuck 12. A guide member 23 having a vertical cross section of a mountain shape is installed in a ring shape at the outer side of the circular plate 22. The guide member 23 is configured to guide the developing solution or the cleaning solution dropping from the wafer W to a liquid receiving part 24 installed outside the circular plate 22. The liquid receiving part 24 is formed of an annular recess portion and is connected to a liquid wasting part (not illustrated) via a liquid discharge pipe 25. In the figures, reference numeral 14 designates delivery pins which can be moved up and down by a lift mechanism 15 in order to deliver the wafer W between the spin chuck 12 and a substrate transfer mechanism (not illustrated).

In the developing apparatus 1 having the above described configuration, the present inventors employ a method which widens a liquid puddle on the surface of the wafer W by moving a contact portion 32 (to be described later in detail), which makes contact with the liquid puddle of the developing solution formed on the wafer W, along the surface of the wafer W while rotating the wafer W. According to this method, by the rotation of the wafer W and the movement of the contact portion 32, the developing solution flows and spreads in a stirred state. Thus, the concentration uniformity of the developing solution existing on the surface of the wafer W increases. As a result, it is possible to improve the critical dimension uniformity. In order to make the contact portion 32 effectively play its role, it is preferable in some embodiments to somewhat widen the area of the contact portion 32. On the other hand, it is also required in some embodiments not to increase the size of the developing apparatus 1. There is also a request that a developing solution nozzle (the first developing solution nozzle 3) provided with the aforementioned contact portion 32 and another type of a developing solution nozzle, e.g., a developing solution nozzle (the second developing solution nozzle 61) used previously, be juxtaposed in one module. There is a demand to reduce the size of the developing apparatus 1. The developing apparatus 1 of this example is configured to satisfy the above request. The detailed configuration of the developing apparatus 1 will be explained below.

The first developing solution nozzle 3 is a developing solution nozzle common to the first and second cup modules 11A and 11B and is configured to wait in a standby position between the first and second cup modules 11A and 11B. The first developing solution nozzle 3 will be described with reference to the vertical sectional side view of the first developing solution nozzle 3 illustrated in FIG. 4. The first developing solution nozzle 3 includes an ejection hole 31 for ejecting the developing solution to form a liquid puddle on the surface of the wafer W, and a contact portion 32 formed smaller than the surface of the wafer W and installed to face the surface of the wafer W. The first developing solution nozzle 3 is formed in, e.g., a cylindrical shape, and is provided with a vertical through-hole 33 in the central portion. The lower end portion of the through-hole 33 is configured as the ejection hole 31. A developing solution supply pipe 36 is disposed in the through-hole 33 such that the through-hole 33 is not open to the atmosphere. Thus, the developing solution supply pipe 36 is connected to the ejection hole 31 opened in the central portion of the contact portion 32 formed of the lower surface of the first developing solution nozzle 3. The ejection hole 31 is opened, for example, on the center axis of the first developing solution nozzle 3, namely in the central portion of the contact portion. In this example, the developing solution supply pipe 36 includes a straight pipe 341 and a resin tube 342. For example, the diameter of the through-hole 33 is reduced at the lower portion. The fore end of the straight pipe 341 is positioned by a stepped portion is formed in this way. However, the present disclosure is not limited to this configuration.

The contact portion 32 is installed so as to face the surface of the wafer W mounted on the spin chuck 12. When the diameter of the wafer W is, e.g., 300 mm, the diameter d1 of the contact portion 32 is 30 mm to 200 mm, 100 mm in this example. For example, a resin is used as the material of the first developing solution nozzle 3 so that the developing solution can be stirred by the surface tension as described later. Examples of the resin may include PFA (tetrafluoroethylene-perfluoroalkyl vinyl ether copolymer), PTFE (polytetrafluoroethylene) and quartz (glass).

The upper surface of the first developing solution nozzle 3 is fixed to the fore end of an arm 41 via a support member 35. The base end of the arm 41 is connected to a first moving mechanism 42. The first moving mechanism 42 is configured to move along a guide rail 43 extending horizontally in the arrangement direction of the first and second cup modules 11A and 11B (the Y-axis direction). Furthermore, the first moving mechanism 42 is configured such that the arm 41 is vertically movably supported by a lift mechanism (not illustrated). The first developing solution nozzle 3 is configured to move up and down between a height position, which is the processing position where the developing solution is supplied to the wafer W held on the spin chuck 12, and a height position, which is the position upon moving between the standby position and the processing position. Thus, the first developing solution nozzle 3 is configured to be able to move between the processing position and the standby position by the first moving mechanism 42.

The developing solution is supplied from the developing solution supply pipe 36 to the ejection hole 31 and is ejected from the ejection hole 31 onto the wafer W. The developing solution supply pipe 36 is fixed to, e.g., the arm 41 and the support member 35. In the figures, reference numeral 361 designates a supply source of a developing solution, e.g., a negative type resist in this example. The supply source 361 of the developing solution is connected to the upstream end of the developing solution supply pipe 36. The supply source 361 of the developing solution includes a pump, a valve, etc. The supply source 361 of the developing solution is configured to supply the developing solution to the first developing solution nozzle 3 in response to a control signal transmitted from a controller 200 which will be described later. The first developing solution nozzle 3 is not limited to this example. For example, a flat developing solution flow space extending along the contact portion 32 may be formed at the lower side of the through-hole 33. A plurality of ejection holes communicating with the flow space may be formed over the entire plane of the contact portion 32 positioned under the flow space.

Figure 5:
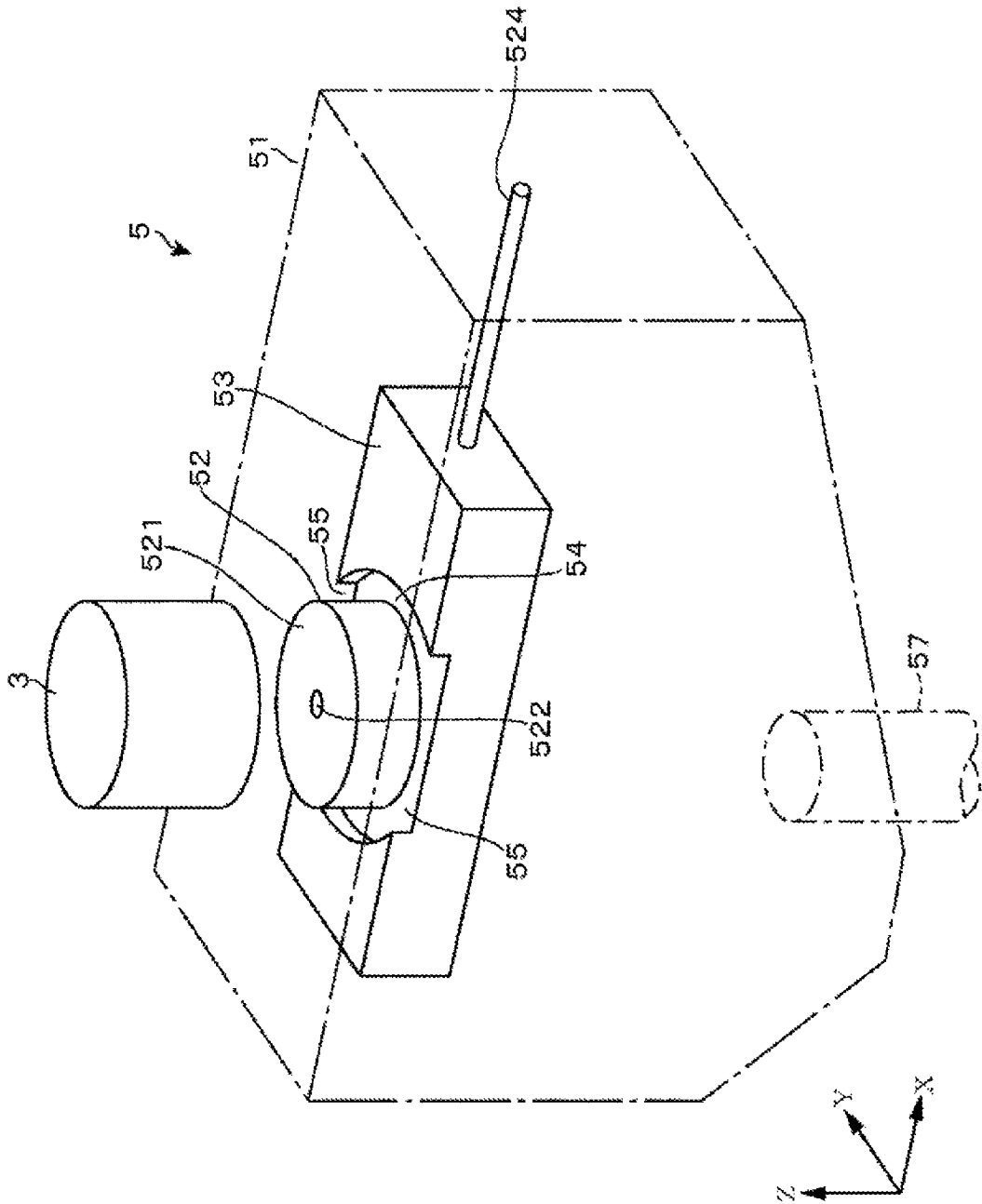
FIG. 5 is perspective view illustrating one example of a standby part installed in the developing apparatus.
Figure 6:
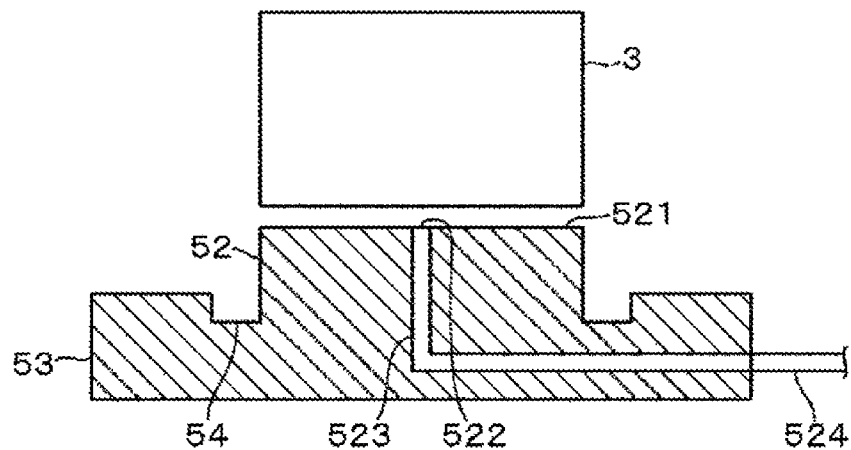
FIGS. 6 and 7 are vertical sectional side views of the standby part.
Figure 7:
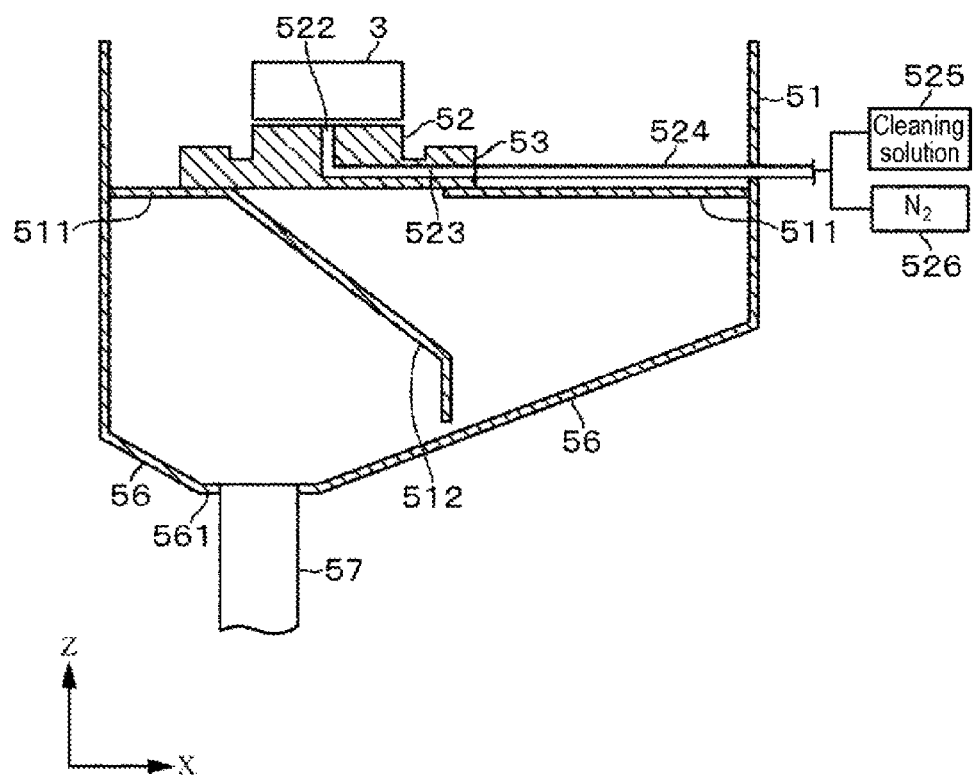

A standby part 5 is installed in the standby position of the first developing solution nozzle 3. As illustrated in FIGS. 5 to 7, the standby part 5 includes an accommodation container 51 and a base portion 52 accommodated within the accommodation container 51. The base portion 52 is formed in, e.g., a cylindrical shape. The upper surface of the base portion 52 is configured to serve as a guide surface portion 521 of a cleaning solution. The guide surface portion 521 is formed into a size substantially equal to or larger than the contact portion 32 of the first developing solution nozzle 3. The base portion 52 is installed in a support stand 53 having, e.g., an approximately rectangular parallelepiped shape. A recess portion 54 is formed around the base portion 52 in the support stand 53 so as to surround the base portion 52. Cutout portions 55 for allowing the cleaning solution existing within the recess portion 54 to flow out toward the lower side are formed in some parts of the recess portion 54.

In the base portion 52, for example, an ejection hole 522 for ejecting a cleaning solution toward the central portion of the guide surface portion 521 is formed and a cleaning solution supply path 523 communicating with the ejection hole 522 is formed. Furthermore, the supply path 523 is connected to a supply source 525 of a cleaning solution and a supply source 526 of a drying gas, e.g., a nitrogen gas, via a cleaning solution supply pipe 524. For example, a developing solution is used as the cleaning solution. Each of the supply sources 525 and 526 includes a pump, a valve, etc. Each of the supply sources 525 and 526 is configured to supply a cleaning solution or a nitrogen gas to the base portion 52 in response to a control signal transmitted from a controller 200 which will be described later. As the cleaning solution, it is possible to use pure water, a post-development rinsing solution, etc.

The accommodation container 51 will be described with reference to FIG. 7. For example, the lower surfaces of the longitudinal-direction (X-axis direction) opposite end portions of the support stand 53 are supported by support plates 511. At the lower side of the support stand 53, there is installed a guide plate 512 which is inclined downward to guide the cleaning solution flowing out from the cutout portions 55 of the support stand 53 toward the lower side and which has a vertical downstream end portion. A bottom plate 56 of the accommodation container 51 is configured such that the height position becomes lowest at an inside location compared to the longitudinal opposite ends thereof. A drain path 57 is connected to a lowest surface 561. That is, the bottom plate 56 is also inclined downward. The cleaning solution flowing along the guide plate 512 is guided by the bottom plate 56 so as to flow toward the drain path 57.

Receiving parts 58 for receiving the developing solution dropping from the first developing solution nozzle 3 during movement of the first developing solution nozzle 3 are installed between the standby position of the first developing solution nozzle 3 and the inside of the cups 2 of the cup modules 11A and 11B where the first developing solution nozzle 3 is used. The receiving parts 58 are installed, for example, at the width-direction (Y-axis direction) opposite sides of the standby part 5, in the position lower than the height position of the first developing solution nozzle 3 during movement of the first developing solution nozzle 3 and higher than the cups 2 existing in the processing position (the position illustrated in FIG. 1). Moreover, for example, the receiving parts 58 are installed to overlap with the cups 2 when seen in a plan view.

Furthermore, the developing apparatus 1 includes a first nozzle unit 6A and a second nozzle unit 6B, each of which includes a second developing solution nozzle 61. These nozzle units 6A and 6B are configured in the substantially same manner. As illustrated in FIGS. 1 to 3, each of the nozzle units 6A and 6B is configured by installing the second developing solution nozzle 61, a cleaning nozzle 62 for supplying a cleaning solution onto the surface of the wafer W, and a gas nozzle 63 for injecting a gas toward the surface of the wafer W, to the tip of a common arm 641 or 642.

Figure 8:
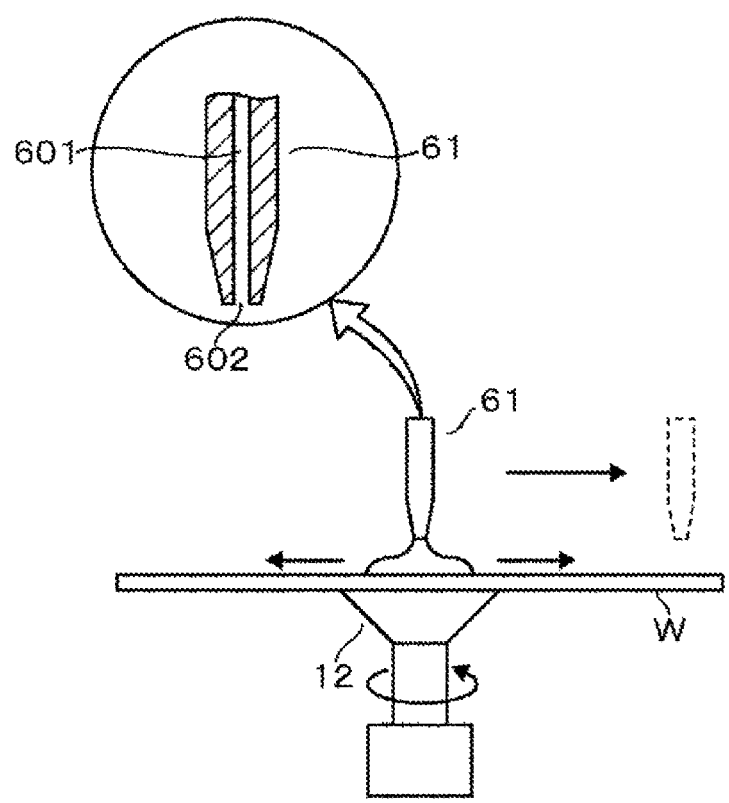
FIG. 8 is a side view illustrating one example of a second developing solution nozzle.

The second developing solution nozzle 61 is different from the first developing solution nozzle 3 in terms of the structure and the supply method of the developing solution. For example, as illustrated in FIG. 8, the second developing solution nozzle 61 of this example includes a vertically-extending straight-pipe-type supply path 601 formed therein. An ejection hole 602 having a diameter of, e.g., 2 mm to 3 mm, is formed in the lower end portion of the supply path 601. Similar to, e.g., the second developing solution nozzle 61, each of the cleaning nozzle 62 and the gas nozzle 63 is configured to include a straight-pipe-type supply path. As illustrated in FIG. 3, the second developing solution nozzle 61, the cleaning nozzle 62 and the gas nozzle 63 are respectively connected to a supply source 361 of a developing solution, a supply source 362 of a cleaning solution, and a supply source 363 of a gas, e.g., a nitrogen gas, via supply paths 611, 621 and 631, respectively. Each of the supply sources 361 to 363 includes a pump, a valve, etc. Each of the supply sources 361 to 363 is configured to supply the developing solution (or the cleaning solution or the nitrogen gas) to the second developing solution nozzle 61, the cleaning nozzle 62, and the gas nozzle 63 respectively in response to a control signal transmitted from the controller 200.

The first nozzle unit 6A is used exclusively for the first cup module 11A. The standby position of the first nozzle unit 6A is set at the opposite side of the second cup module 11B when using the first cup module 11A as a reference. Furthermore, the second nozzle unit 6B is used exclusively for the second cup module 11B. The standby position of the second nozzle unit 6B is set at the opposite side of the first cup module 11A when using the second cup module 11B as a reference. Nozzle baths 671 and 672 for keeping the first and second nozzle units 6A and 6B on standby are respectively installed in the standby positions.

The arms 641 and 642 are vertically movably supported by a second moving mechanism 651 on one side and a second moving mechanism 652 on the other side, respectively. The second moving mechanisms 651 and 652 are configured to respectively move along guide rails 661 and 662 extending horizontally in the Y-axis direction. In this way, the second developing solution nozzle 61, the cleaning nozzle 62, and the gas nozzle 63 as the first and second nozzle units 6A and 6B are respectively installed in the second moving mechanism 651 on one side and the second moving mechanism 652 on the other side. Each of the first and second nozzle units 6A and 6B is configured to move between the processing position where the developing solution and so forth are supplied to the wafer W mounted on the spin chuck 12 and the standby position. The first moving mechanism 42 and the second moving mechanisms 651 and 652 are configured to move the first developing solution nozzle 3 and the first and second nozzle units 6A and 6B between the standby positions and the processing positions without interfering with one another.

Now, a method of coating a developing solution using the second developing solution nozzle 61 will be briefly described with reference to FIG. 8. First, the second developing solution nozzle 61 is moved to a position where the developing solution is supplied to the central portion of the wafer W mounted on the spin chuck 12. Then, the wafer W is rotated. The second developing solution nozzle 61 is moved from the central portion of the wafer W toward the peripheral edge portion of the wafer W in the state in which the developing solution is supplied from the second developing solution nozzle 61. Thus, the developing solution is spread all over the entire surface of the wafer W while being spread along the surface of the wafer W by the centrifugal force. In this way, the coating of the developing solution is performed.

In the present embodiment, for example, the standby position of the first nozzle unit 6A, the first cup module 11A, the standby position of the first developing solution nozzle 3, the second cup module 11B, and the standby position of the second nozzle unit 6B are arranged sequentially from the left side of the drawing in FIGS. 1 and 2. Furthermore, in the first and second nozzle units 6A and 6B, for example, the second developing solution nozzle 61, the cleaning nozzle 62, and the gas nozzle 63 are installed sequentially from the side far away from each of the cup modules 11A and 11B (see FIG. 9).

A controller 200 formed of a computer is installed in the developing apparatus 1. The controller 200 includes a program storage part (not illustrated). A program formed of, e.g., software, in which commands are organized so as to perform a developing process and a cleaning process described in the below-mentioned action, is stored in the program storage part. As the program is read out into the controller 200, the controller 200 outputs control signals to the respective parts of the developing apparatus 1. The control signals control the respective operations such as the movement of the first developing solution nozzle 3 and the first and second nozzle units 6A and 6B by the moving mechanisms 42, 651 and 652; the supply of the developing solution, the cleaning solution, and the nitrogen gas by the supply source 361 of the developing solution, the supply source 362 of the cleaning solution, and the supply source 363 of the nitrogen gas; the rotation of the wafer W by the spin chuck 12; and the up and down movement of the pins 14. Thus, it is possible to perform a developing process and a cleaning process with respect to the wafer W as will be described later. The program is stored in the program storage part in a state in which the program is recorded in a memory medium such as, e.g., a hard disk, a compact disk, a magneto-optical disk or a memory card.

Figure 9:
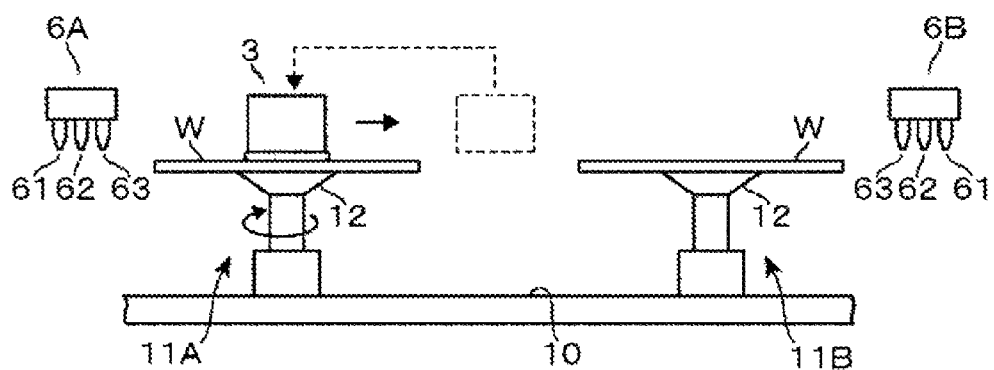
FIG. 9 is a side view for explaining the action of the developing apparatus.
Figure 13:
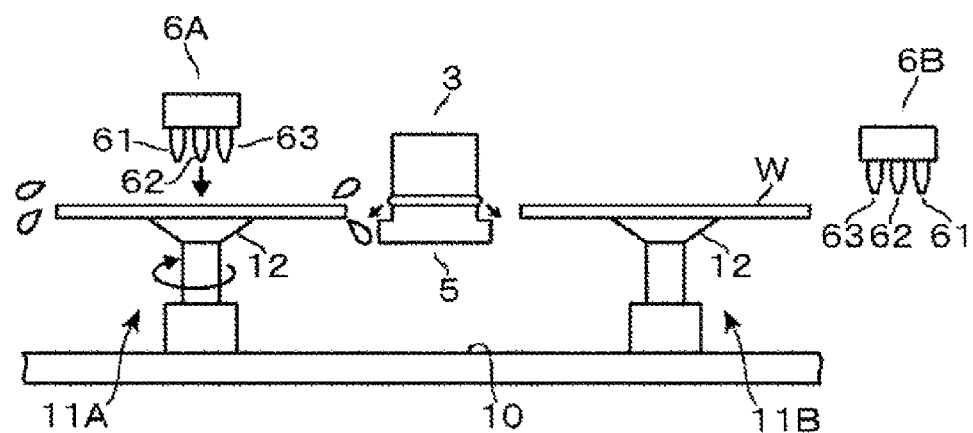
FIG. 13 is a side view for explaining the action of the developing apparatus.
Figure 14:
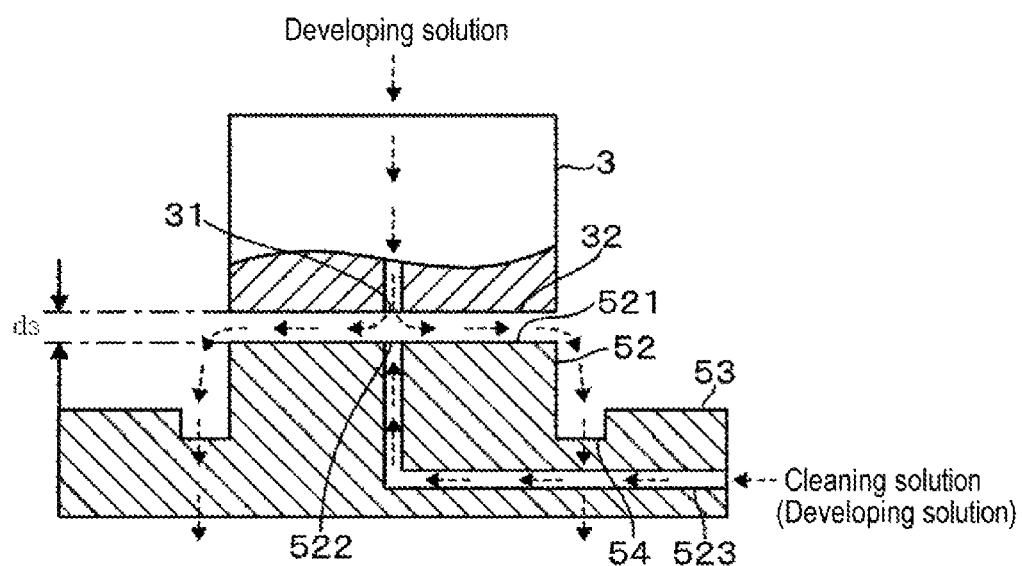
FIG. 14 is a vertical sectional side view illustrating the action of the standby part.
Figure 15:
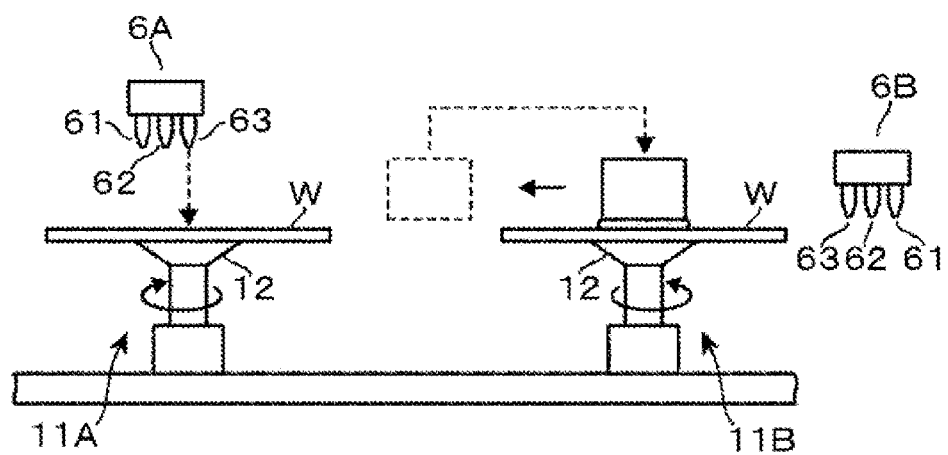
FIG. 15 is a side view for explaining the action of the developing apparatus.

Subsequently, the sequences of a developing process and a cleaning process performed by using the developing apparatus 1 will be described with reference to FIGS. 9 to 16. FIGS. 9, 13 and 15 schematically illustrate the spin chucks 12, the first developing solution nozzle 3, and the first and second nozzle units 6A and 6B in the first and second cup modules 11A and 11B. In FIGS. 10 to 12 and 16, the first developing solution nozzle 3 staying in the standby position is indicated by a dot line.

First, a negative resist is coated. By virtue of a substrate transfer mechanism (not illustrated), the wafer W exposed along a predetermined pattern is loaded in the direction indicated by an arrow in FIG. 2, namely from the opposite side of the region where the guide rail 43 and the like are installed when using the first cup module 11A as a reference. The wafer W is delivered to the spin chuck 12 of the first cup module 11A. Subsequently, the first developing solution nozzle 3 is moved from the standby position to above the central portion of the wafer W. The contact portion 32 of the first developing solution nozzle 3 is moved down so as to face the wafer W in close proximity thereto. In this case, the distance d2 (see FIG. 4) between the surface of the wafer W and the lower surface of the first developing solution nozzle 3 is, for example, from 0.5 mm to 2 mm. In the state in which the contact portion 32 comes close to the wafer W in this way, the developing solution is ejected from the ejection hole 31 onto the wafer W, whereby a liquid puddle 30 remaining in contact with the contact portion 32 is formed under the first developing solution nozzle 3 (see FIG. 10).

Figure 10:
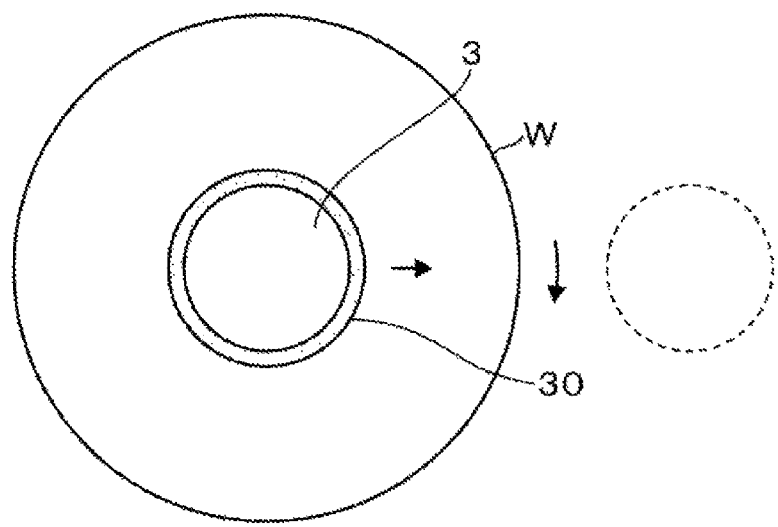
FIGS. 10 to 12 are plan views illustrating how to coat a developing solution on a wafer.
Figure 11:
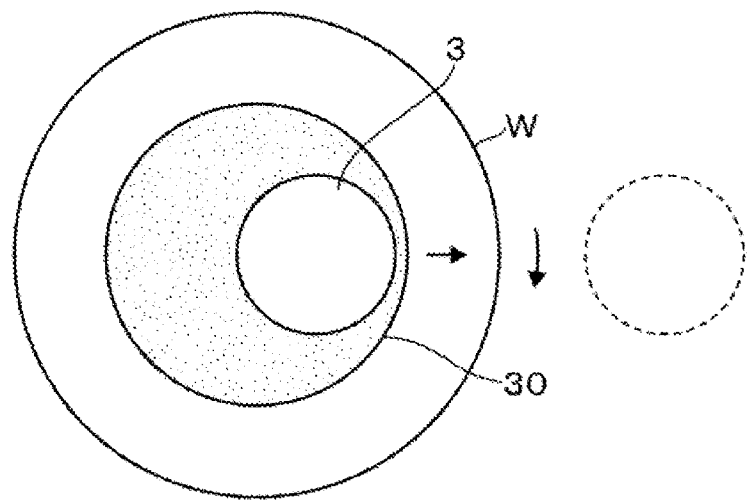
Figure 12:
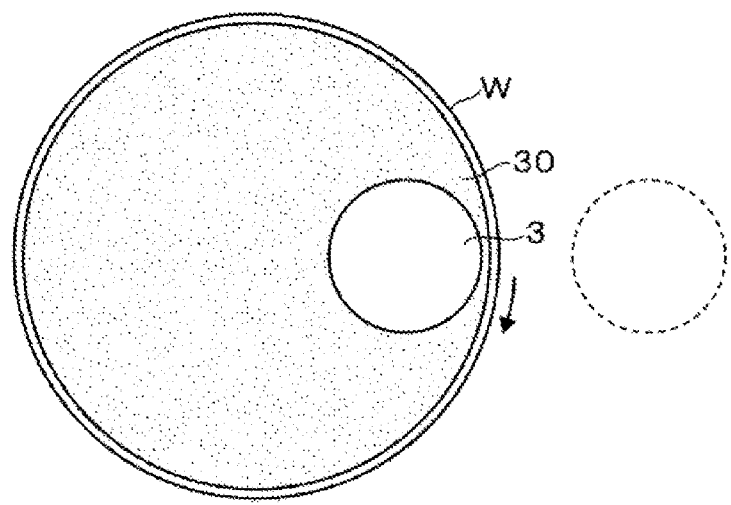

Thereafter, as illustrated in FIGS. 9 and 10, the wafer W is rotated, for example, clockwise in a plan view. If the revolution number of the wafer W reaches, e.g., 10 rpm, the wafer W is continuously rotated at 10 rpm. As illustrated in FIG. 11, the first developing solution nozzle 3 is moved from the central portion of the wafer W toward the peripheral edge portion existing at the side of the standby part 5. That is, the first developing solution nozzle 3 is moved at, e.g., 10 mm/sec, toward the right side in FIGS. 9 to 11 along the surface of the wafer W in the radial direction. Thus, the liquid puddle 30 is spread toward the peripheral edge portion of the wafer W in the state in which the liquid puddle 30 makes contact with the contact portion 32 of the first developing solution nozzle 3. Alternatively, the liquid puddle 30 may be spread on the surface of the wafer W by moving the contact portion 32 remaining in contact with the liquid puddle 30, for example, from the peripheral edge portion of the rotating wafer W existing at the side of the standby part 5 toward the central portion of the wafer W together with the supply position of the developing solution.

Under the first developing solution nozzle 3, a surface tension acts between the liquid puddle 30 and the contact portion 32 of the first developing solution nozzle 3. Thus, the liquid puddle 30 and the contact portion 32 are attracted to each other. If the first developing solution nozzle 3 is moved while rotating the wafer W, the developing solution is stirred under the first developing solution nozzle 3 and the concentration uniformity of the developing solution increases. Since the concentration uniformity of the developing solution increases in the region under the contact portion 32 of the first developing solution nozzle 3 within the plane of the wafer W, the reaction between the resist and the developing solution is generated with high uniformity. That is, the critical dimension uniformity of the resist pattern increases.

The first developing solution nozzle 3 is moved so as not to overtake the spreading liquid puddle 30. The reason is as follows. If overtaking occurs, the developing solution is broken into pieces on the surface of the wafer W and a plurality of liquid puddles is formed at a plurality of points. In that case, the respective liquid puddles are individually spread on the surface of the wafer W and the interfaces of the respective liquid puddles are combined with one another. Under this influence, the critical dimension of the resist pattern at those points differs from the critical dimension of the resist pattern at other points. That is, there is a concern that the in-plane critical dimension uniformity (CDU) of the resist pattern may decrease. Therefore, the movement speed of the first developing solution nozzle 3 is set such that overtaking does not occur.

The diameter d1 of the contact portion 32 of the first developing solution nozzle 3, the revolution number of the wafer W, and the horizontal movement speed of the first developing solution nozzle 3 are set based on the aforementioned conditions so that the contact portion 32 of the first developing solution nozzle 3 can pass through the entire surface of the wafer W. The horizontal movement speed of the first developing solution nozzle 3 is, for example, from 10 mm/sec to 100 mm/sec. The revolution number of the wafer W may be set at 100 rpm or less, more specifically 10 rpm to 60 rpm, in order to suppress the liquid splashing when the developing solution is ejected onto the wafer W.

If the first developing solution nozzle 3 is moved to above the peripheral edge portion of the wafer W in this way and the entire surface of the wafer W is covered with the developing solution, the movement of the first developing solution nozzle 3 is stopped and the rotation of the wafer W is stopped. Then, for example, simultaneously with the stop of the movement of the first developing solution nozzle 3, the supply of the developing solution from the first developing solution nozzle 3 is stopped and the first developing solution nozzle 3 is returned to the standby position (see FIG. 13). Subsequently, the wafer W is stopped for a predetermined time, and through the liquid puddle 30, the reaction between the resist film and the developing solution is further generated on the entire surface of the wafer W. The entire surface (whole surface) of the wafer W refers to the entire formation region of the resist pattern. Accordingly, e.g., for a wafer W in which the formation region of the resist pattern is not provided in the peripheral edge portion of the wafer W, the liquid puddle 30 of the developing solution may not be formed in the peripheral edge portion, or the peripheral edge portion may be coated with the liquid puddle 30.

Subsequently, for example, a cleaning process for the surface of the wafer W is performed in the first cup module 11A. That is, after the reaction between the resist film and the developing solution is sufficiently generated on the entire surface of the wafer W, the cleaning nozzle 62 is moved to above the central portion of the wafer W as illustrated in FIG. 13. The cleaning solution is supplied from the cleaning nozzle 62. The wafer W is rotated, for example, clockwise in a plan view, at a predetermined revolution number.

In this way, the cleaning solution is ejected onto the central portion of the wafer W and is spread toward the peripheral edge portion of the wafer W by the centrifugal force, thereby removing the liquid puddle 30 of the developing solution from the wafer W. After the cleaning solution is ejected from the cleaning nozzle 62 for a predetermined time, the ejection is stopped. Subsequently, in this example, the gas nozzle 63 is moved to above the central portion of the wafer W and the nitrogen gas is supplied from the gas nozzle 63, while rotating the wafer W at a predetermined revolution number. Thus, the cleaning solution existing on the wafer W is centrifugally dehydrated from the surface of the wafer W by the rotation of the wafer W and the supply of the nitrogen gas, whereby the wafer W is dried. Thereafter, the wafer W of the first cup module 11A is unloaded from the developing apparatus 1 by a substrate transfer mechanism (not illustrated).

Meanwhile, the first developing solution nozzle 3 waits in the standby part 5. For example, cleaning of the first developing solution nozzle 3 is performed during this waiting period. In this cleaning process, the first moving mechanism 42 disposes the first developing solution nozzle 3 such that, as illustrated in FIG. 14, the contact portion 32 faces the guide surface portion 521 of the base portion 52 with a gap therebetween. In this case, the distance d3 between the lower surface of the first developing solution nozzle 3 and the guide surface portion 521 of the base portion 52 is, for example, from 0.5 mm to 2 mm.

Subsequently, the developing solution is supplied to the first developing solution nozzle 3 and is ejected from the ejection hole 31, while the developing solution as a cleaning solution is supplied to the base portion 52. Furthermore, the developing solution is also supplied from the ejection hole 522 of the base portion 52. The cleaning solution (the developing solution) is filled in the gap between the guide surface portion 521 and the contact portion 32 of the first developing solution nozzle 3. The cleaning solution flows out from the gap to the side surfaces of the base portion 52, flows downward from the cutout portions 55 via the recess portion 54 of the support stand 53, and is drained from the drain path 57. Subsequently, for example, while maintaining the first developing solution nozzle 3 in the same height position, the supply of the cleaning solution is stopped and then the supply of the nitrogen gas is started. Thus, the gap between the guide surface portion 521 and the contact portion 32 is dried. In this way, the contact portion 32 of the first developing solution nozzle 3 is cleaned by the contact and flow of the cleaning solution.

Figure 16:
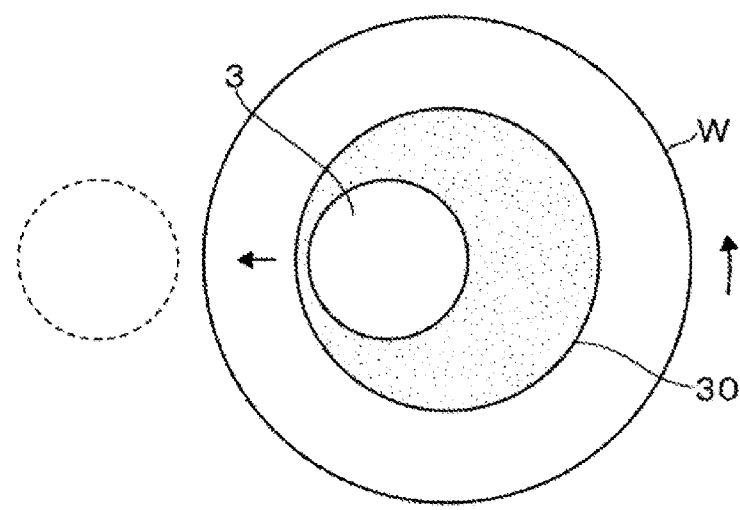
FIG. 16 is a plan view illustrating how to coat a developing solution on a wafer.

In this example, the delivery of the wafer W to the spin chuck 12 of the second cup module 11B is started while performing the developing process in the first cup module 11A. In the second cup module 11B, as illustrated in FIG. 15, the first developing solution nozzle 3 is moved from the standby position to above the central portion of the wafer W. The contact portion 32 of the first developing solution nozzle 3 comes close to the surface of the wafer W. The developing solution is ejected from the ejection hole 31. Subsequently, while rotating the wafer W, for example, counterclockwise in a plan view as illustrated in FIGS. 15 and 16, the first developing solution nozzle 3 is moved toward the peripheral edge portion of the wafer W existing at the side of the standby part 5. That is, the first developing solution nozzle 3 is moved at, e.g., 10 mm/sec, toward, e.g., the left side in FIGS. 2, 15 and 16 along the surface of the wafer W in the radial direction of the wafer W. For example, while performing the developing process in the second cup module 11B, the cleaning process of the wafer W is performed and the drying process is started in the first cup module 11A.

In this way, the rotation directions of the spin chucks 12 of the first and second cup modules 11A and 11B during the supply of the developing solution to the wafer W are set to become opposite to each other. By setting the rotation directions of the spin chucks 12 to become opposite to each other, the rotation directions of the wafers W seen from the moving first developing solution nozzle 3 are coincident with each other. In the first and second cup modules 11A and 11B, for example, the first developing solution nozzle 3 is moved from the central portion of the wafer W toward the peripheral edge portion existing at the side of the standby position, thereby performing the coating of the developing solution. For example, in the first cup module 11A, the first developing solution nozzle 3 is moved to the right side during the supply of the developing solution. In the second cup module 11B, the first developing solution nozzle 3 is moved to the left side during the supply of the developing solution. As such, the moving directions of the first developing solution nozzle 3 are opposite to each other. By setting the rotation directions of the spin chucks 12 to become opposite to each other, the relationships between the rotation directions of the wafer W and the moving directions of the first developing solution nozzle 3 during the supply of the developing solution are matched with each other.

Thus, the coating method of the developing solution in the first cup module 11A matches with the coating method of the developing solution in the second cup module 11B. This suppresses generation of process variations between the two cup modules 11A and 11B. Further, since the process conditions are identical in the two cup modules 11A and 11B, evaluation becomes easier in the inspection of a pattern. However, the first and second cup modules 11A and 11B may have the same rotation directions of the spin chucks 12 during the supply of the developing solution to the wafer W. In this case, for example, in the two cup modules 11A and 11B, the first developing solution nozzle 3 may be moved in the same direction from the central portions of the wafers W. For example, in the first cup module 11A, the first developing solution nozzle 3 may be moved from the central portion of the wafer W toward the peripheral edge portion existing at the side of the standby part 5 (toward the right side in the figures). In the second cup module 11B, the first developing solution nozzle 3 may be moved from the central portion of the wafer W toward the peripheral edge portion existing at the opposite side from the standby part 5 (toward the right side in the figures).

Likewise, in the second cup module 11B, after the developing solution is supplied to the entire surface of the wafer W, the first developing solution nozzle 3 is returned to the standby position and the rotation of the wafer W is stopped. Subsequently, the reaction between the resist and the developing solution is sufficiently generated in the state in which the wafer W is stopped. Thereafter, the cleaning solution is supplied from the cleaning nozzle 62 of the second nozzle unit 6B to the wafer W, thereby removing the developing solution existing on the wafer W. Thereafter, the nitrogen gas is supplied from the gas nozzle 63 of the second nozzle unit 6B, thereby drying the wafer W. Then, the wafer W is unloaded from the second cup module 11B. For example, while performing the cleaning of the wafer W in the second cup module 11B, the delivery of the wafer W to the spin chuck 12 of the first cup module 11A is started. The developing process and the cleaning process are performed by the same operations as described above. In this way, the supply of the developing solution is performed by using the first developing solution nozzle 3 with respect to the wafers W of a certain lot. Thereafter, for example, lots are switched. The supply of the developing solution is performed using the second developing solution nozzle 61.

In this example, the rotation directions of the spin chucks 12 and the moving directions of the first developing solution nozzle 3 during the supply of the developing solution to the wafer W are set to become opposite to each other between the first and second cup modules 11A and 11B. However, at least one of the rotation direction of the spin chuck 12 and the moving direction of the first developing solution nozzle 3 may be the same in the first and second cup modules 11A and 11B.

In the aforementioned example, while performing the supply of the developing solution in the first cup module 11A, the replacement of the wafer W is started in the second cup module 11B. While performing the cleaning of the wafer W in the second cup module 11B, the replacement of the wafer W is started in the second cup module 11A. However, the present disclosure is not necessarily limited to this example. After performing a series of processes of developing, cleaning and drying of a wafer W in one of the cup modules 11A and 11B, and unloading the wafer W, a wafer may be loaded to another one of the cup modules 11B and 11A and the series of processes may be performed. In addition, the cleaning of the first developing solution nozzle 3 in the standby part 5 may be performed after supplying the developing solution to a predetermined number of wafers W, or may be performed at the timing at which lots are switched.

According to the embodiment described above, the liquid puddle 30 is formed on the surface of the wafer W by the first developing solution nozzle 3. The developing solution is coated so as to spread the liquid puddle 30. Thus, under the first developing solution nozzle 3, the developing solution flows and is stirred by the rotation of the wafer W and the movement of the first developing solution nozzle 3. This suppresses generation of variations in the concentration of the developing solution. Furthermore, unlike the case where the developing solution is spread by the centrifugal force, there is no variation in the concentration of the developing solution within the plane of the wafer W, which may otherwise be generated by the flow of the developing solution. For that reason, the reaction between the resist and the developing solution is generated with good uniformity within the plane of the wafer W. It is possible to improve the critical dimension uniformity (CDU) within the plane of the wafer W. Furthermore, as compared with the case where the developing solution is spread by the centrifugal force, the overflow of the developing solution outside of the wafer W is suppressed. It is therefore possible to reduce the consumption amount of the developing solution. In addition, as compared with the case where the developing solution is spread by the centrifugal force, it is possible to reduce the revolution number of the wafer W. This suppresses the liquid splashing by which the developing solution is scattered far away due to the rotation of the wafer W.

In the embodiment described above, the standby position of the first developing solution nozzle 3 is set between the first cup module 11A and the second cup module 11B which are arranged by being spaced apart from each other. These two cup modules 11A and 11B are disposed in some distance in order to suppress the liquid splashing from the adjacent cup module and the influence on the mutual processing atmospheres. In this example, the distance d4 (see FIG. 2) between the closest portions of the cups 2 of the first and second cup modules 11A and 11B is, for example, 200 mm. By using the space originally secured between the two cup modules 11A and 11B as the standby position of the first developing solution nozzle 3 in this way, it is possible to effectively use the space and to suppress the increase in the size of the developing apparatus 1. As described in the "BACKGROUND" section, it is preferable in some embodiments to widen the contact portion 32 of the first developing solution nozzle 3 in order to improve the critical dimension uniformity. In the present embodiment, the contact portion 32 having a diameter d1 of about 100 mm is used. By disposing the standby position of the first developing solution nozzle 3 between the first and second cup modules 11A and 11B, even if the contact portion 32 becomes larger, it is possible to install the contact portion 32 without having to change the size of a conventional developing apparatus 1.

In the present embodiment, there is provided the first developing solution nozzle 3 common to the first cup module 11A and the second cup module 11B. Therefore, as compared with the case where the dedicated first developing solution nozzles 3 are prepared for each of the cup modules 11A and 11B, it is possible to increase the size of the first developing solution nozzle 3. By increasing the size of the first developing solution nozzle 3 in this way, the substantial movement distance between the central portion and the peripheral edge portion of the wafer W becomes short. Therefore, the time required for coating the developing solution is shortened. For this reason, even when the coating in the two cup modules 11A and 11B is performed with the common first developing solution nozzle 3, it is possible to suppress the reduction in the throughput.

Furthermore, in the present embodiment, there are provided the second developing solution nozzles 61 which are different from the first developing solution nozzle 3 in terms of the structure and the developing solution supply method. This enables one developing apparatus 1 to supply the developing solution in different supply methods. It is therefore possible to implement a plurality of different types of developing processes, whereby the degree of freedom of the developing processes increases. Moreover, the first developing solution nozzle 3 uses the space originally secured between the first and second cup modules 11A and 11B as the standby position. Therefore, even when the first developing solution nozzle 3 and the second developing solution nozzles 61 are installed, it is possible to suppress the increase in the size of the developing apparatus 1.

In the embodiment described above, the cleaning nozzle 62 and the gas nozzle 63 are installed in each of the second moving mechanisms 651 and 652. Therefore, after the developing process is completed, it is possible to rapidly remove the liquid puddle 30 of the developing solution and to rapidly dry the surface of the wafer W. It is also possible to rapidly unload the wafer W from each of the cup modules 11A and 11B.

In the embodiment described above, the standby part 5 is installed in the standby position of the first developing solution nozzle 3. It is therefore possible to perform the cleaning of the contact portion 32 of the first developing solution nozzle 3 at an appropriate timing and to perform the supply of the developing solution while maintaining cleanliness. Furthermore, in the embodiment described above, the receiving parts 58 are installed between the standby position of the first developing solution nozzle 3 and the inside of the cups 2 of the respective cup modules 11A and 11B where the first developing solution nozzle 3 is used. It is therefore possible to prevent the developing solution, which flows and drops from the first developing solution nozzle 3 during the movement of the first developing solution nozzle 3, from adhering to the wafer W or the cup 2.

Figure 17:
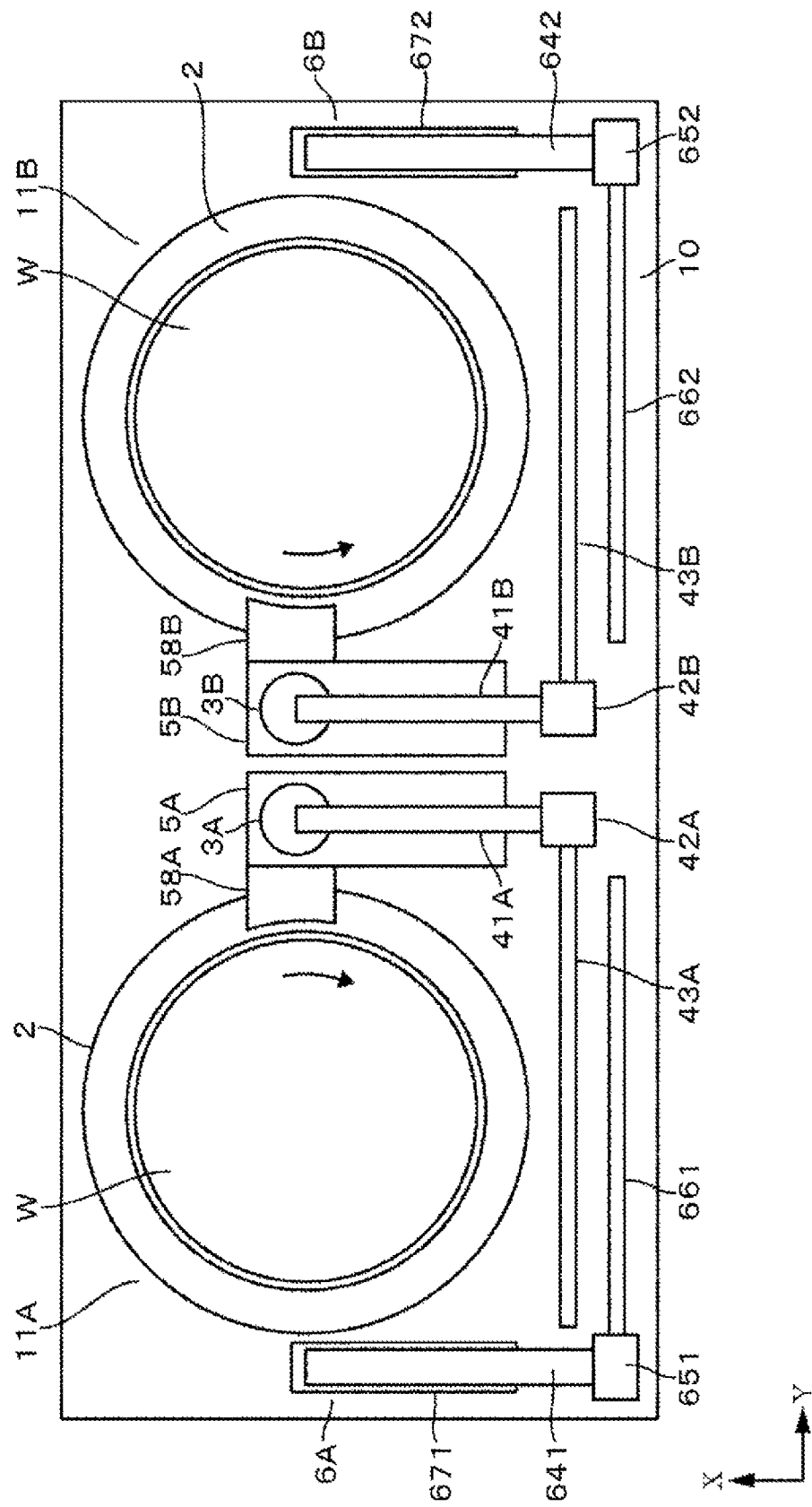
FIG. 17 is a plan view illustrating a first modification of the first embodiment of the present disclosure.

Next, a first modification of the first embodiment will be described with reference to FIG. 17. This modification differs from the above-described embodiment in that dedicated first developing solution nozzles 3A and 3B are respectively prepared for the first and second cup modules 11A and 11B and the standby positions of the two first developing solution nozzles 3A and 3B are set between the two cup modules 11A and 11B. The contact portion 32 of each of the first developing solution nozzles 3A and 3B has a size smaller than the contact portion 32 of the first developing solution nozzle 3 described above. For example, the diameter of the contact portion 32 of each of the first developing solution nozzles 3A and 3B is set as 50 mm. Except for this point, the first developing solution nozzles 3A and 3B have a configuration similar to the first developing solution nozzle 3 described above.

The first developing solution nozzles 3A and 3B are respectively supported by arms 41A and 41B and are configured such that the first developing solution nozzles 3A and 3B can be moved up and down by first moving mechanisms 42A and 42B. The first developing solution nozzles 3A and 3B are also configured such that the first developing solution nozzles 3A and 3B can move in the transverse direction (the Y-axis direction) along guide rails 43A and 43B. In FIG. 17, reference numerals 5A and 5B designate standby parts and reference numerals 58A and 58B designate receiving parts. The standby parts 5A and 5B and the receiving parts 58A and 58B have a configuration similar to the standby part 5 and the receiving parts 58 described above. The first moving mechanisms 42A and 42B and the second moving mechanisms 651 and 652 are configured to, without interfering with each other, move the first developing solution nozzles 3A and 3B and the first and second nozzle units 6A and 6B between the respective standby positions and the respective processing positions. Other configurations are similar to those of the above-described embodiment. In FIG. 17, like components are designated by like reference symbols and the descriptions for the like components are omitted.

In the first cup module 11A, a liquid puddle 30 is formed in the central portion of the wafer W by the first developing solution nozzle 3A. Then, the spin chuck 12 is rotated clockwise in a plan view. While ejecting the developing solution from the first developing solution nozzle 3A, the first developing solution nozzle 3A is moved from the central portion of the wafer W to the peripheral edge portion existing at the side of the standby part 5A. Accordingly, the liquid puddle 30 is spread by the contact portion 32, whereby the developing solution is coated on the entire surface of the wafer W. On the other hand, in the second cup module 11B, the spin chuck 12 is rotated counterclockwise in a plan view. While ejecting the developing solution from the first developing solution nozzle 3B, the first developing solution nozzle 3B is moved from the central portion of the wafer W to the peripheral edge portion existing at the side of the standby part 5B. Accordingly, the liquid puddle 30 is spread by the contact portion 32, whereby the developing solution is coated on the entire surface of the wafer W.

Even in this modification, similar to the first embodiment, it is possible to improve the critical dimension uniformity (CDU) within the plane of the wafer W. It is also possible to reduce the consumption amount of the developing solution and to suppress the splashing of the developing solution. By setting the diameter of the contact portion 32 as about 50 mm, it is possible to set the standby positions of the two first developing solution nozzles 3A and 3B between the first and second cup modules 11A and 11B and to suppress the increase in the size of the apparatus. Since the dedicated first developing solution nozzle 3A and 3B are respectively provided for the first and second cup modules 11A and 11B, it is possible to independently perform the supply of the developing solution in the first and second cup modules 11A and 11B. Thus, it is possible to achieve improvement in throughput.

In the aforementioned examples, the first developing solution nozzles 3, 3A and 3B and the second developing solution nozzles 61 have been described as the developing solution nozzles which supply a developing solution for a negative resist. Alternatively, the first developing solution nozzles 3, 3A and 3B and the second developing solution nozzles 61 may be configured to supply a developing solution for a positive resist. Furthermore, the first developing solution nozzles 3, 3A and 3B and the second developing solution nozzles 61 may supply different developing solutions. One of the first developing solution nozzle 3 and the second developing solution nozzles 61 may supply a developing solution for a negative resist and the other may supply a developing solution for a positive resist. Different developing solutions include developing solutions which have the same components but have different composition.

Next, a second modification of the first embodiment will be described with reference to FIG. 18. This modification is directed to an example in which a third developing solution nozzle exclusively used for the first cup module 11A and a third developing solution nozzle exclusively used for the second cup module 11B are further provided. These third developing solution nozzles are different from the first developing solution nozzle 3 in terms of the structure and the developing solution supply method. Moreover, the third developing solution nozzles use a developing solution which differs from the developing solution used in the second developing solution nozzles 61. In this modification, the first developing solution nozzle 3 and the second developing solution nozzles 61 are configured to supply a developing solution for a negative resist. The third developing solution nozzles are configured to supply a developing solution for a positive resist.

Figure 18:
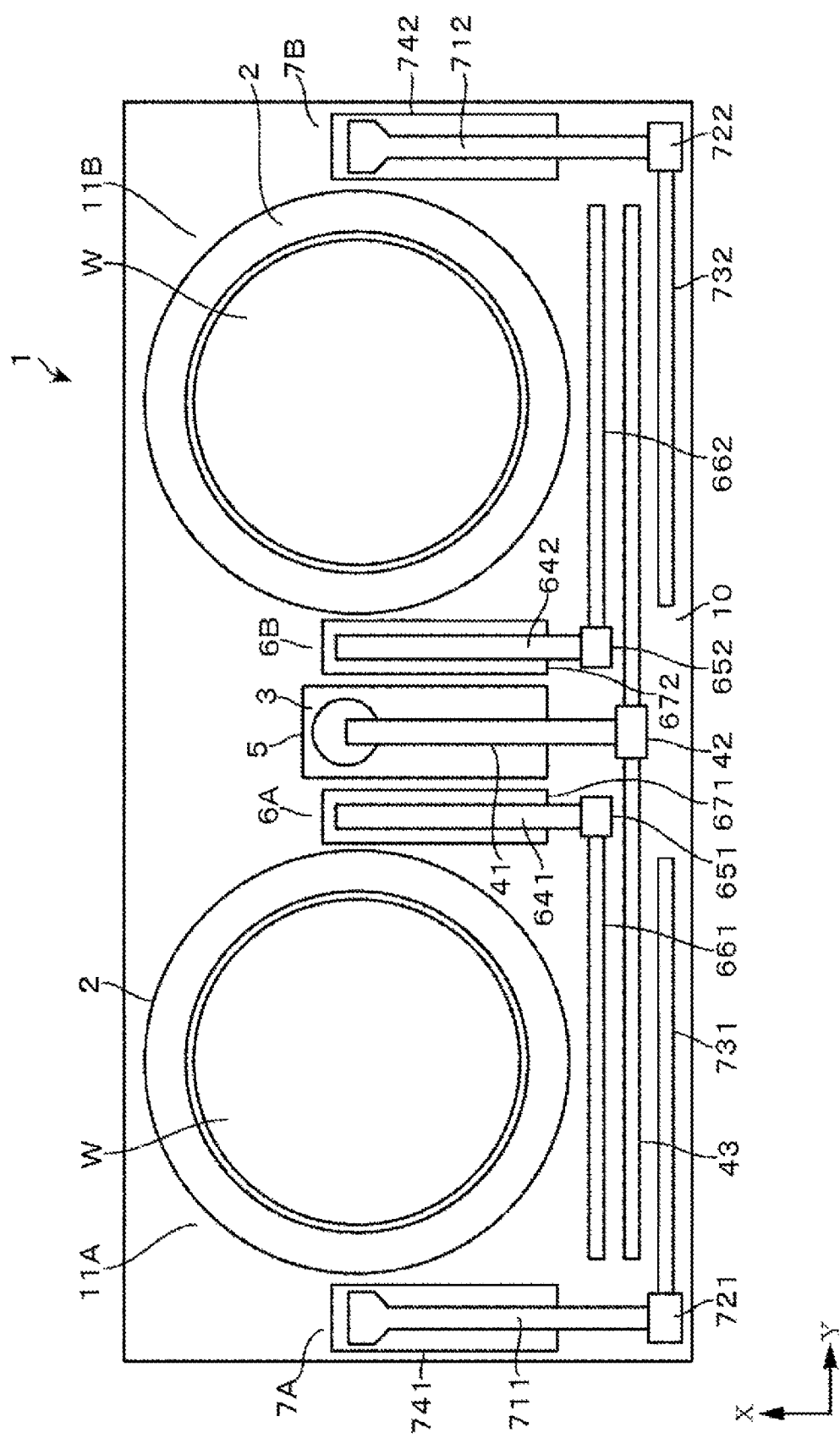
FIG. 18 is a plan view illustrating a second modification of the first embodiment of the present disclosure.

As illustrated in FIG. 18, the developing apparatus 1 includes a third nozzle unit 7A exclusively used for the first cup module 11A and a fourth nozzle unit 7B exclusively used for the second cup module 11B. The third developing solution nozzles are installed within the third and fourth nozzle units 7A and 7B. Similar to, e.g., the second developing solution nozzles 61, each of the third developing solution nozzles includes a straight-pipe-type supply path and an ejection hole formed at the lower end of the supply path, the ejection hole having a diameter of, e.g., 2 mm to 3 mm. Furthermore, each of the third and fourth nozzle units 7A and 7B is configured by installing, e.g., five kinds of straight-pipe-type nozzles including a cleaning nozzle, a gas nozzle, and so on in addition to a third developing solution nozzle, to the tip of a common arm 711 or 712.

In this modification, the first developing solution nozzle 3 common to the first and second cup modules 11A and 11B is used. The standby position of the first developing solution nozzle 3 is set between the first and second cup modules 11A and 11B. The standby position of the first nozzle unit 6A including the second developing solution nozzle 61 exists between the first and second cup modules 11A and 11B. The standby position of the first nozzle unit 6A is set at a location closer to the first cup module 11A than the first developing solution nozzle 3. Furthermore, the standby position of the second nozzle unit 6B including the second developing solution nozzle 61 exists between the first and second cup modules 11A and 11B. The standby position of the second nozzle unit 6B is set at a location closer to the second cup module 11B than the first developing solution nozzle 3. The standby position of the third nozzle unit 7A including the third developing solution nozzle is located opposite to the first developing solution nozzle 3 with the first cup module 11A therebetween. The standby position of the fourth nozzle unit 7B including the third developing solution nozzle is located opposite to the first developing solution nozzle 3 with the second cup module 11B therebetween.

The arms 711 and 712 are vertically movably supported by third moving mechanisms 721 and 722, respectively. These third moving mechanisms 721 and 722 are configured to move along guide rails 731 and 732 horizontally extending in the transverse direction (the Y-axis direction). In this way, the third and fourth nozzle units 7A and 7B are installed such that each of the third and fourth nozzle units 7A and 7B can move between the processing position where the developing solution and so forth are supplied to the wafer W mounted on the spin chuck 12 and the standby position. The method of supplying the developing solution using the third developing solution nozzles is similar to the method of supplying the developing solution using the second developing solution nozzles 61 described above. Furthermore, nozzle baths 741 and 742 are respectively installed in the standby positions of the third and fourth nozzle units 7A and 7B. The first moving mechanism 42, the second moving mechanisms 651 and 652, and the third moving mechanisms 721 and 722 are configured to, without interfering with one another, move the first developing solution nozzle 3, the first and second nozzle units 6A and 6B, and the third and fourth nozzle units 7A and 7B between the respective standby positions and the respective processing positions. This modification has a configuration similar to the above-described first embodiment except for the difference in the standby positions of the first and second nozzle units 6A and 6B. Like components are designated by like reference symbols and the descriptions for like components are omitted.

In this modification, the standby position of the first nozzle unit 6A, the first cup module 11A, the standby position of the third nozzle unit 7A, the standby position of the first developing solution nozzle 3, the standby position of the fourth nozzle unit 7B, the second cup module 11B, and the standby position of the second nozzle unit 6B may be arranged sequentially from the left side in FIG. 18. Moreover, the standby position of the first nozzle unit 6A, the first cup module 11A, the standby position of the third nozzle unit 7A, the standby position of the first developing solution nozzle 3, the standby position of the second nozzle unit 6B, the second cup module 11B, and the standby position of the fourth nozzle unit 7B may be arranged sequentially from the left side in FIG. 18.

Even in this modification, similar to the first embodiment, it is possible to improve the critical dimension uniformity (CDU) within the plane of the wafer W. It is also possible to reduce the consumption amount of the developing solution and to suppress the splashing of the developing solution. Furthermore, one developing apparatus 1 is provided with the first developing solution nozzle 3, the second developing solution nozzles 61 which are different from the first developing solution nozzle 3 in terms of the structure and the developing solution supply method, and the third developing solution nozzles which are different from the first developing solution nozzle 3 in terms of the structure and the developing solution supply method and use the developing solution different from the developing solution used in the second developing solution nozzles 61. Accordingly, it is possible to suppress the increase in the size of the apparatus while further increasing the degree of freedom of the developing process.

Figure 19:
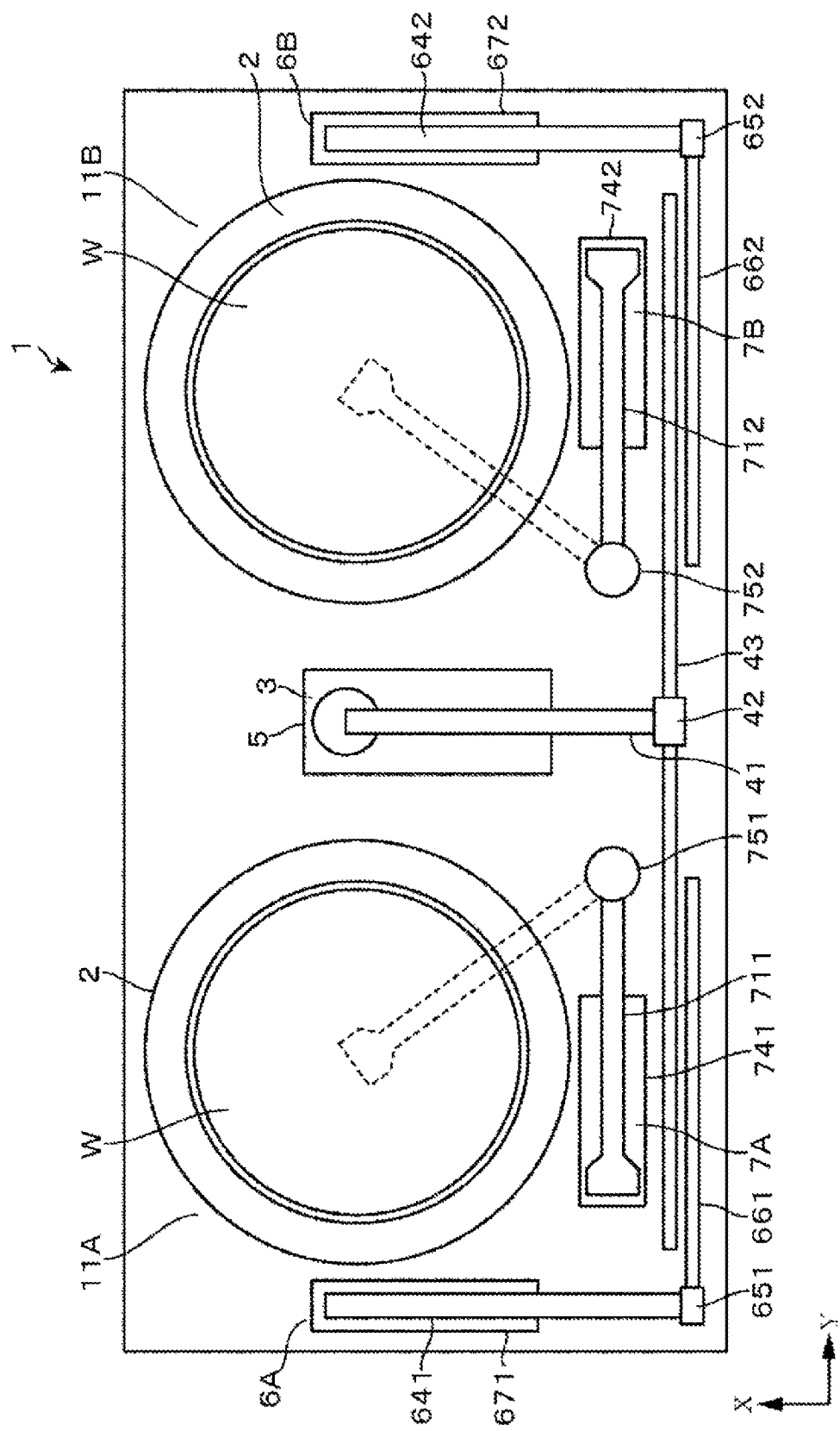
FIG. 19 is a plan view illustrating a third modification of the first embodiment of the present disclosure.

Next, a third modification of the first embodiment will be described with reference to FIG. 19. In this modification, the standby positions of the third and fourth nozzle units 7A and 7B each including the third developing solution nozzle are respectively set in the positions adjacent to the front sides of the first cup module 11A and the second cup module 11B when the arrangement direction of the first and second cup modules 11A and 11B (the Y-axis direction) is regarded as the left-right direction. Furthermore, the standby position of the first developing solution nozzle 3 is set between the first and second cup modules 11A and 11B. The standby positions of the first and second nozzle units 6A and 6B each including the second developing solution nozzle 61 are respectively set at the opposite sides of the first developing solution nozzle 3 with the first cup module 11A or the second cup module 11B therebetween.

The third moving mechanisms 751 and 752 of the third and fourth nozzle units 7A and 7B are installed at the side of the base end portions of the respective arms 711 and 712 and are configured to move the arms 711 and 712 up and down and to pivot the arms 711 and 712 between the standby position and the processing position where the supply of the developing solution is performed. The first moving mechanism 42, the second moving mechanisms 651 and 652, and the third moving mechanisms 751 and 752 are configured to, without interfering with one another, move the first developing solution nozzle 3, the first and second nozzle units 6A and 6B, and the third and fourth nozzle units 7A and 7B between the respective standby positions and the respective processing positions. This modification has a configuration similar to the above-described first embodiment except for the installation of the third and fourth nozzle units 7A and 7B. Like components are designated by like reference symbols and the descriptions for like components are omitted. Moreover, while interchanging the standby position of the first nozzle unit 6A with the standby position of the third nozzle unit 7A, the standby position of the second nozzle unit 6B may be interchanged with the standby position of the fourth nozzle unit 7B. In this case, the first and second nozzle units 6A and 6B are pivoted.

Figure 20:
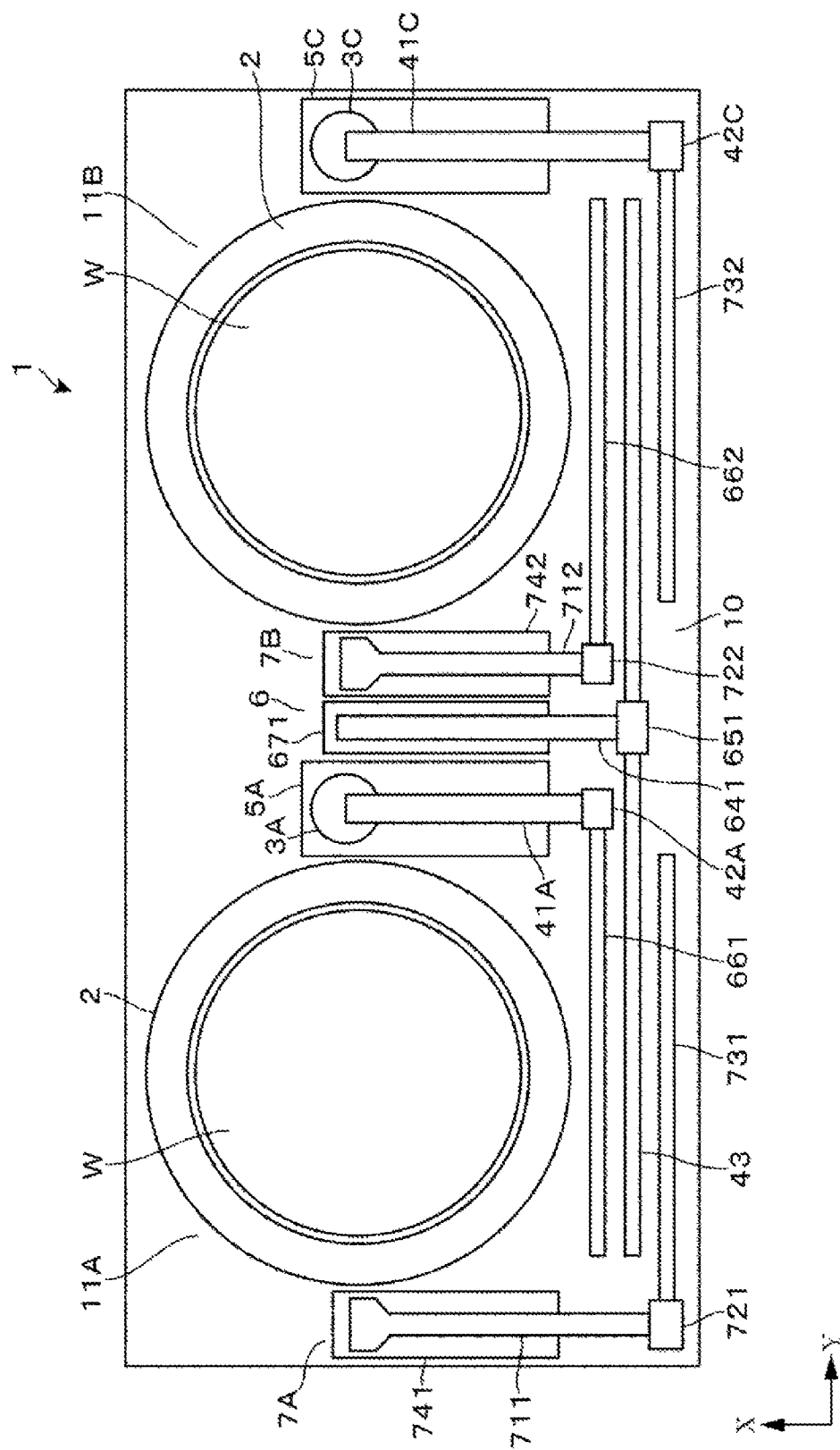
FIG. 20 is a plan view illustrating a fourth modification of the first embodiment of the present disclosure.

Next, a fourth modification of the first embodiment will be described with reference to FIG. 20. In the modification, there is provided a common nozzle unit 6 which includes a second developing solution nozzle 61, a cleaning nozzle 62, and a gas nozzle 63 and which is capable of supplying various kinds of fluids to any of the wafers W existing within the first and second cup modules 11A and 11B. The standby position (the nozzle bath 671) of the nozzles 61 to 63 of the common nozzle unit 6 is set at the middle location between the cup modules 11A and 11B.

When seen from the standby position of the common nozzle unit 6, at the side of the first cup module 11A, there is disposed a standby part 5A which becomes a standby position of a first developing solution nozzle 3A installed to be exclusively used in the first cup module 11A. Furthermore, when seen from the standby position of the first developing solution nozzle 3A, at the opposite side of the first cup module 11A, there is disposed a standby position (a nozzle bath 741) of a third nozzle unit 7A to be exclusively used in the first cup module 11A.

On the other hand, when seen from the standby position of the aforementioned common nozzle unit 6, at the side of the second cup module 11B, there is provided a standby position (a nozzle bath 742) of a fourth nozzle unit 7B to be exclusively used in the second cup module 11B. Furthermore, when seen from the standby position of the fourth nozzle unit 7B, at the opposite side of the second cup module 11B, there is provided a standby part 5C which becomes a standby position of another developing solution nozzle 3C installed to be exclusively used in the second cup module 11B. In this regard, the other developing solution nozzle 3C, the arm 41C for supporting the same, the moving mechanism 42C, and the standby part 5C are similar in configuration and function to the first developing solution nozzle 3A, the arm 41A, the first moving mechanism 42A, and the standby part 5A existing at the side of the first cup module 11A.

As described above, in the developing apparatus 1 according to the fourth modification, the second developing solution nozzle 61 is common to the first and second cup modules 11A and 11B. The standby position of the second developing solution nozzle 61 is disposed between the cup modules 11A and 11B. The standby positions (the standby parts 5A and 5C) of the first developing solution nozzle 3A and the other developing solution nozzle 3C are disposed adjacent to the respective cup modules 11A and 11B. As a result, while avoiding the occurrence of an operation in which the developing solution nozzles 3A and 3C each provided with the contact portion 32 having a large area are moved across other nozzle units 6, 7A, and 7B, it is possible to perform the supply of the developing solution with three kinds of nozzles 3A and 3C and nozzle units 6, 7A, and 7B with respect to any of the wafers W in the respective cup modules 11A and 11B.

In the meantime, the common nozzle unit 6 disposed in the center region is moved to the positions where the fluids are supplied to the wafer W existing within each of the cup modules 11A and 11B, for example, above the first developing solution nozzle 3A and the fourth nozzle unit 7B disposed at both sides of the common nozzle unit 6. As described above with reference to FIG. 8, the second developing solution nozzle 61 and so forth installed in the common nozzle unit 6 have a straight pipe structure which has a small-diameter ejection hole 602 at the tip portion thereof. Therefore, for example, by installing a suck-back mechanism, which sucks up the developing solution existing within the supply path 601, at the upstream side, it is possible to make a structure in which it is more difficult for the developing solution to drip compared to the developing solution nozzles 3A and 3C each provided with the contact portion 32.

The developing apparatus 1 of this modification complies with the requirement of the present disclosure in that the standby position (the standby part 5A) of the first developing solution nozzle 3A (which performs the supply of the developing solution exclusively to the first cup module 11A) is set between the first and second cup modules 11A and 11B.

Even in this modification, similar to the first embodiment, it is possible to improve the critical dimension uniformity within the plane of the wafer W. It is also possible to reduce the consumption amount of the developing solution and to suppress the splashing of the developing solution. Furthermore, the first developing solution nozzle 3, the second developing solution nozzle 61, and the third developing solution nozzle are installed in one developing apparatus 1. Accordingly, it is possible to reduce the size of the apparatus while further increasing the degree of freedom of the developing process.

In the configuration of the first embodiment described above, the second developing solution nozzle 61 or the third developing solution nozzle may be commonly used in the first and second cup modules 11A and 11B. However, in the first embodiment, it is not necessarily required to install the second developing solution nozzle 61, the third developing solution nozzle, the cleaning nozzle 62 and the gas nozzle 63, the standby part 5 or the receiving parts 58. In addition, the second developing solution nozzle 61 and the third developing solution nozzle may have a structure similar to the first developing solution nozzle 3.

Second Embodiment

Next, descriptions will be made on a second embodiment of the present disclosure. The second embodiment differs from the above-described first embodiment in that a first standby position of a first developing solution nozzle overlaps with a second standby position of a second developing solution nozzle in an up-down direction. Points differing from the first embodiment will now be described with reference to FIG. 21. In this example, a first cup module 11A, a second cup module 11B, and a third cup module 11C are installed to be spaced apart from each other in the transverse direction.

Figure 21:
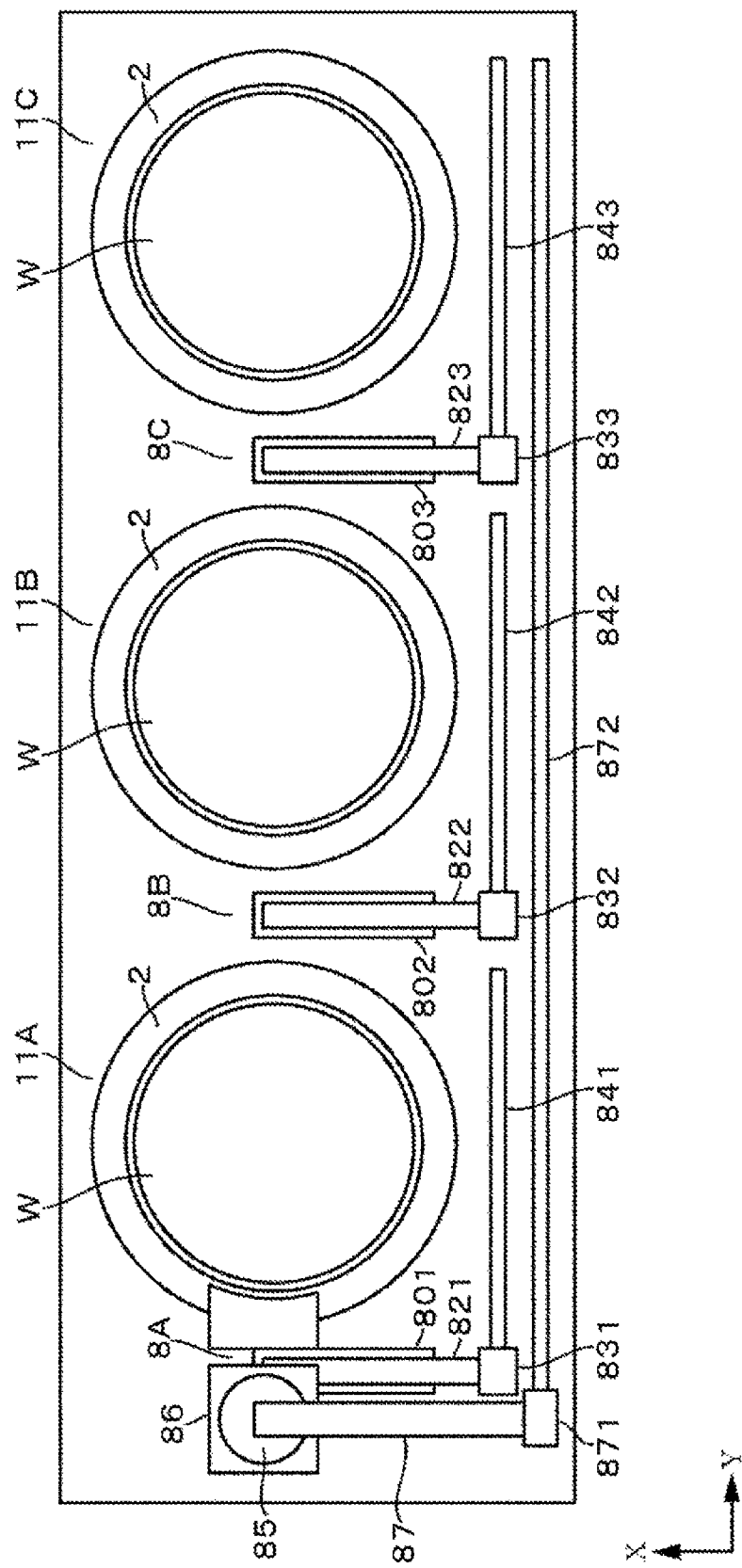
FIG. 21 is a plan view illustrating a second embodiment of the present disclosure.

Nozzle units 8A to 8C each provided with a second developing solution nozzle are prepared for exclusive use in each of the first to third cup modules 11A to 11C. The standby position of each of the nozzle units 8A to 8C is set, for example, at one side in the left-right direction, e.g., the left side, of each of the first to third cup modules 11A to 11C. The respective nozzle units 8A to 8C are similar in configuration to, e.g., the nozzle units 6A and 6B described above. Each of the nozzle units 8A to 8C includes, for example, a second developing solution nozzle, a cleaning nozzle, and a gas nozzle installed at the tip of each of arms 821, 822, and 823. The arms 821, 822, and 823 are vertically movably supported by second moving mechanisms 831, 832, and 833. The nozzle units 8A to 8C are configured such that the nozzle units 8A to 8C can be moved by the second moving mechanisms 831, 832, and 833 between the processing positions where the developing solution is supplied to the wafer W and the standby positions. In FIG. 21, reference numerals 841, 842, and 843 designate guide rails extending in the transverse direction (the Y-axis direction). Reference numerals 801, 802, and 803 designate nozzle baths installed in the respective second standby positions for the standby of the second developing solution nozzles.

Figure 22:
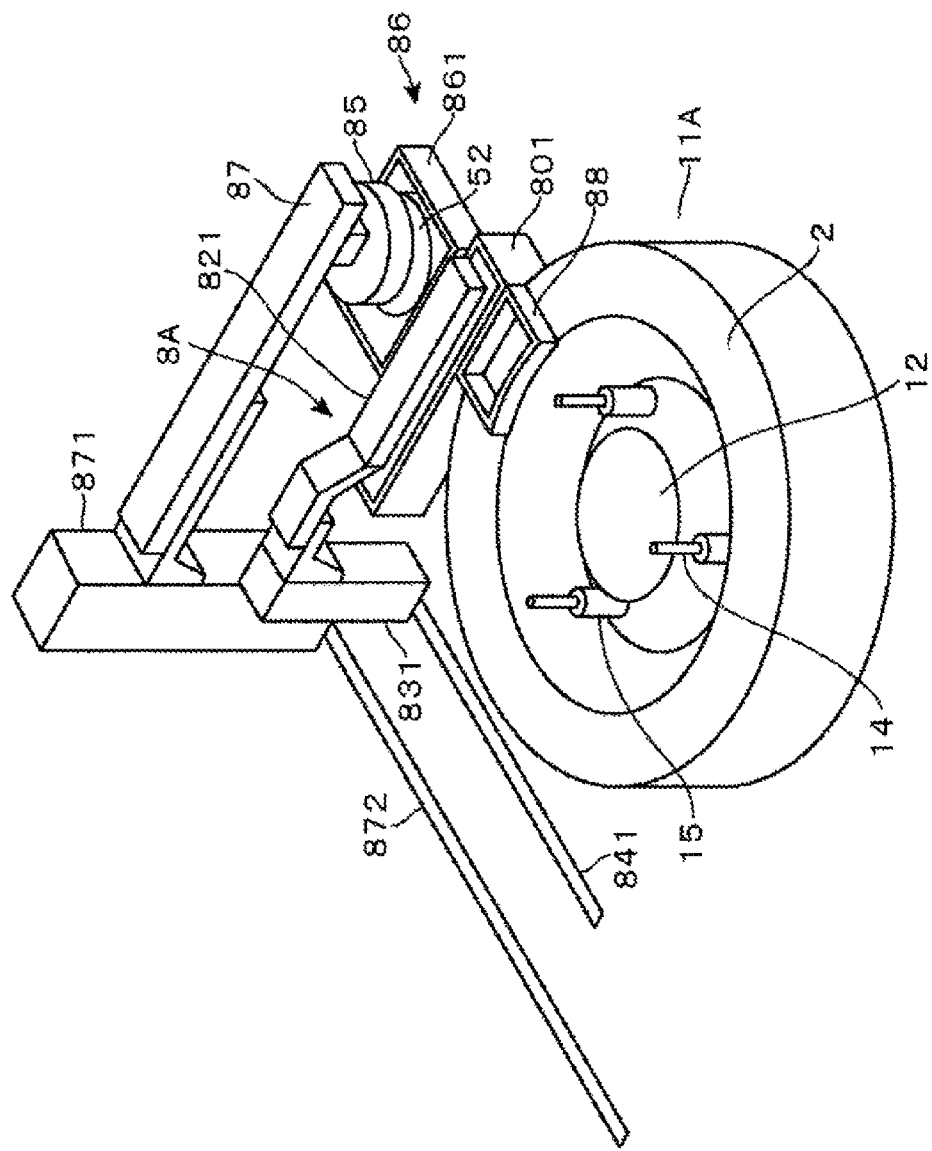
FIG. 22 is a perspective view illustrating a cup module, a first developing solution nozzle, and a nozzle unit (a second developing solution nozzle).

In this example, there is provided a first developing solution nozzle 85 common to the first to third cup modules 11A to 11C. The first standby position of the first developing solution nozzle 85 is set, for example, at the upper side of the second standby position of the nozzle unit 8A for exclusive use in the first cup module 11A. Descriptions will be made with reference to FIG. 22. In FIG. 22, there are illustrated the first cup module 11A, the nozzle unit 8A, and the first developing solution nozzle 85. The first standby position is set in a height position above the horizontal movement region of the nozzle unit 8A. For example, a standby part 86 is installed in the first standby position. In FIG. 22, reference numeral 861 designates an accommodation container. The base portion 52 described above is installed within the accommodation container 861.

The first developing solution nozzle 85 is vertically movably supported by a first moving mechanism 871 via an arm 87. Furthermore, the first moving mechanism 871 is configured to move along a guide rail 872 extending in the transverse direction (the Y-axis direction). In this way, the first developing solution nozzle 85 is configured to move between the first standby position and the respective processing positions of the first to third cup modules 11A to 11C. In FIG. 22, reference numeral 88 designates a receiving part. The first moving mechanism 871 and the second moving mechanisms 831 to 833 are configured to, without interfering with one another, move the first developing solution nozzle 85 and the nozzle units 8A to 8C between the respective standby positions and the respective processing positions. Other configurations are similar to those of the first embodiment. Like components are designated by like reference symbols and the descriptions for like components are omitted.

Even in this embodiment, similar to the first embodiment, it is possible to improve the critical dimension uniformity within the plane of the wafer W. It is also possible to reduce the consumption amount of the developing solution and to suppress the splashing of the developing solution. Furthermore, the first standby position of the first developing solution nozzle 85 and the second standby position of the second developing solution nozzle are set to overlap with each other in the up-down direction. Therefore, as compared with the case where the first standby position and the second standby position are separately set when seen in a plan view, it is possible to reduce the installation space and to suppress the increase in the size of the apparatus.

The first standby position of the first developing solution nozzle 85 may be set at the lower side of the second standby position of the nozzle unit 8A including the second developing solution nozzle so as to overlap with the second standby position of the nozzle unit 8A. Furthermore, the first standby position of the first developing solution nozzle 85 may be set at either one of the upper and lower sides of the second standby position of each of the nozzle units 8B and 8C for exclusive use in the cup modules 11B and 11C other than the first cup module 11A so as to overlap with the second standby position of each of the nozzle units 8B and 8C. In addition, dedicated first developing solution nozzles 85 may be prepared for each of the first to third cup modules 11A to 11C. The first standby positions of the respective dedicated first developing solution nozzles 85 may be set to overlap with the second standby positions of the nozzle units 8A to 8C each including the second developing solution nozzle in the up-down direction.

Furthermore, a first developing solution nozzle 85 and a second developing solution nozzle which are common to the three cup modules 11A to 11C may be installed. The first standby position of the first developing solution nozzle 85 and the second standby position of the second developing solution nozzle may be set to overlap with each other in the up-down direction. In this case, the first standby position and the second standby position may be set between any two of the three cup modules 11A to 11C or may be set at the left side of the first cup module 11A in FIG. 21 or at the right side of the third cup module 11C in FIG. 21. Furthermore, the second developing solution nozzle may be commonly used to the three cup modules 11A to 11C and dedicated first developing solution nozzles 85 may be prepared for the respective cup modules 11A to 11C. In this case, the second standby position of the second developing solution nozzle is set to overlap with at least one of the first standby positions of the first developing solution nozzles 85 in the up-down direction.

In this example, the number of the cup modules 11 is not limited to three but may be two or four or more. Furthermore, both the developing solution of the first developing solution nozzle 85 and the developing solution of the second developing solution nozzle may be a developing solution for a negative resist or a positive resist. One of the developing solution of the first developing solution nozzle 85 and the developing solution of the second developing solution nozzle may be a developing solution for a negative resist and the other may be a developing solution for a positive resist. Moreover, the developing solution of the first developing solution nozzle 85 and the developing solution of the second developing solution nozzle may have identical component and composition or may have different component and composition. In addition, a third developing solution nozzle may be installed. The third developing solution nozzle may be exclusively used in each of the cup modules 11 or may be common to the cup modules 11. The standby position of the third developing solution nozzle may overlap with the first standby position of the first developing solution nozzle 85 and the second standby position of the second developing solution nozzle in the up-down direction. The standby position of the third developing solution nozzle may be the position illustrated in FIG. 18 or the position illustrated in FIG. 19. However, in the second embodiment, it is not necessarily required to install the cleaning nozzle and the gas nozzle, the standby part 86 or the receiving part 88.

In the claims, the subject matter is defined by the first cup module and the second cup module. However, the present disclosure may be applied to the case where three or more cup modules are installed. That is, if the relationship between the first cup module and the second cup module among three or more cup modules and other elements satisfies the relationship defined in the claims, the relationship is included in the technical scope of the present disclosure.

Figure 24:
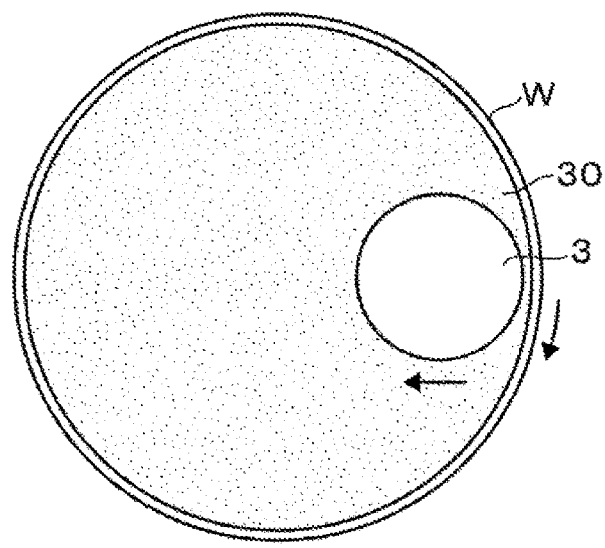
Figure 25:
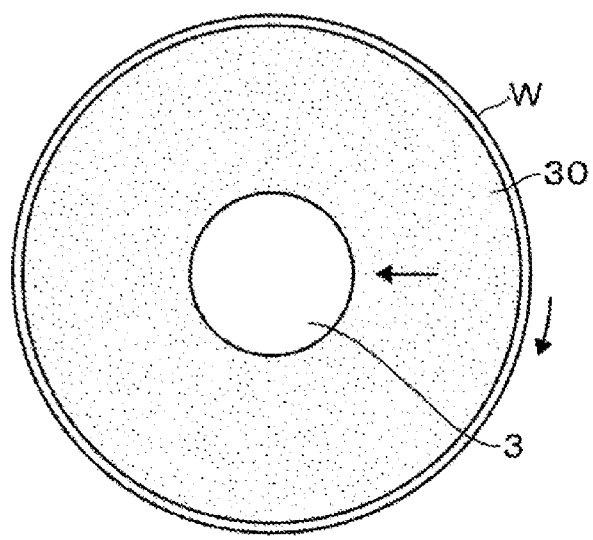

Next, another example of the developing solution supply method implemented using the first developing solution nozzle will be described with reference to FIGS. 23 to 25. In this supply method, the coating of the developing solution is performed by reciprocating the first developing solution nozzle 3 between the central portion of the wafer W and the peripheral edge portion of the wafer W. In this example, a liquid puddle 30 is formed by moving the first developing solution nozzle 3 close to the central portion of the wafer W. In the state in which the wafer W is rotated, the liquid puddle 30 is spread by moving the first developing solution nozzle 3 toward the peripheral edge portion of the wafer W while ejecting the developing solution from the first developing solution nozzle 3 (see FIG. 23). When the first developing solution nozzle 3 reaches the peripheral edge portion, the ejection of the developing solution is stopped. Subsequently, the first developing solution nozzle 3 is moved toward the central portion of the wafer W while rotating the wafer W (see FIG. 24). When the first developing solution nozzle 3 is positioned above the central portion of the wafer W in this way (see FIG. 25), the rotation of the wafer W is stopped. In this method, the respective portions of the entire surface of the wafer W pass through the lower side of the first developing solution nozzle 3 two times. Thus, the developing solution is well stirred and the reaction between the developing solution and the resist is further promoted. It is therefore possible to shorten the time of reaction between the developing solution and the resist taken until the developing solution is cleaned by the supply of the cleaning solution after coating the developing solution. This improves the throughput.

Figure 23:
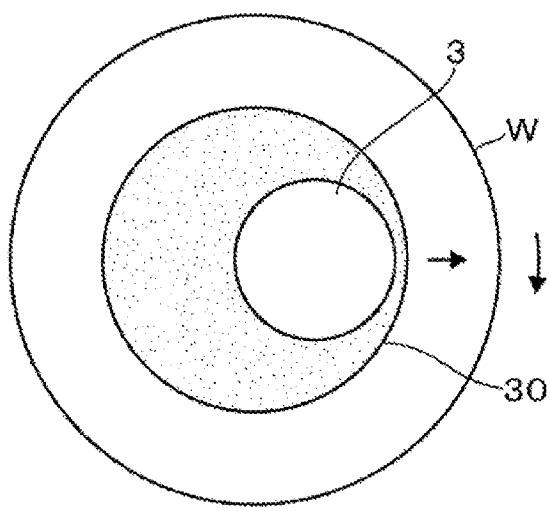
FIGS. 23 to 25 are plan views illustrating how to coat a developing solution on a wafer.

Furthermore, as illustrated in FIG. 23, the coating of the developing solution is performed by moving the first developing solution nozzle 3 from the central portion of the wafer W to the peripheral edge portion. Thereafter, the developing solution existing on the surface of the wafer W is centrifugally dehydrated and removed by rotating the wafer W. Subsequently, as illustrated in FIG. 24, the coating of the developing solution may be performed while moving the first developing solution nozzle 3 from the peripheral edge portion of the wafer W to the central portion. In this way, the developing solution containing a dissolved product generated at the initial stage of development is discharged to the outside of the wafer W and then the wafer W is developed by coating a fresh developing solution. This can further improve the in-plane critical dimension uniformity.

Figure 26:
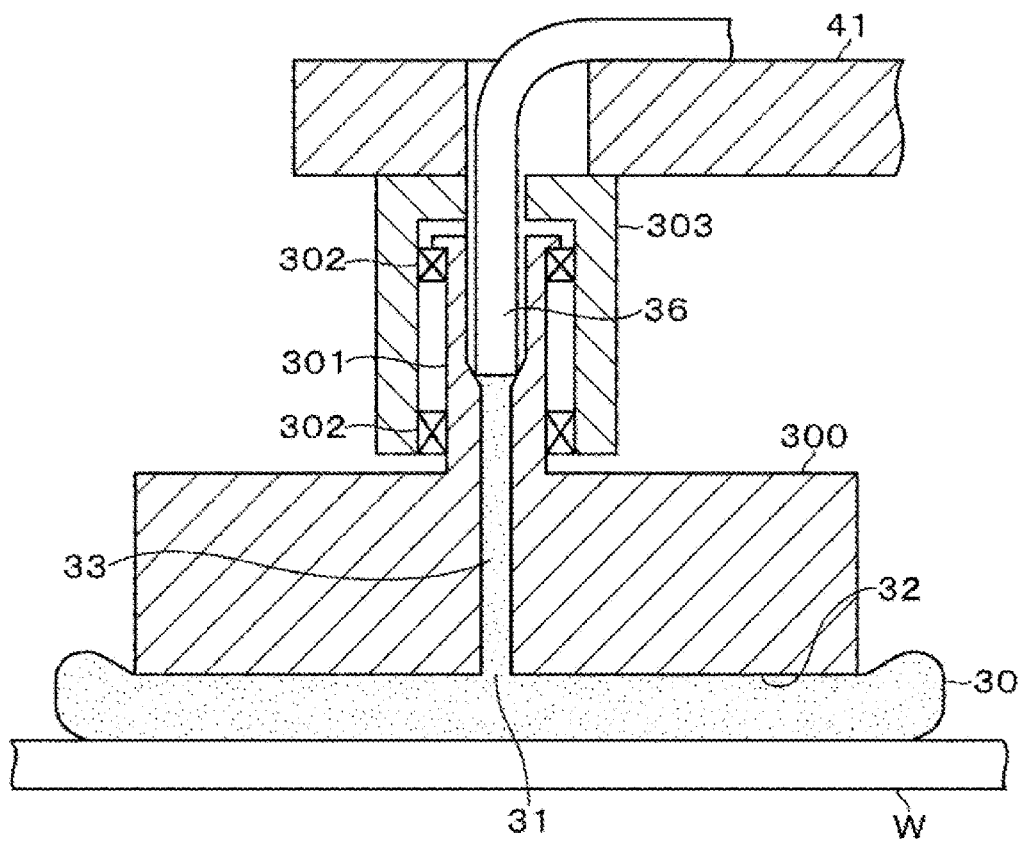
FIG. 26 is a vertical sectional side view illustrating another example of the first developing solution nozzle.

Next, descriptions will be made on another example of the first developing solution nozzle 300. As illustrated in FIG. 26, the first developing solution nozzle 300 is configured such that the first developing solution nozzle 300 can rotate about a vertical axis. A vertical cylindrical body 301 is installed in the central portion of the upper surface of the first developing solution nozzle 300. A base portion 303 is installed around the cylindrical body 301 with a bearing 302 interposed therebetween. In this way, the cylindrical body 301 is configured such that the cylindrical body 301 can be rotated with respect to the base portion 303 through the bearing 302 by a rotating mechanism (not illustrated). The interior of the cylindrical body 301 communicates with a through-hole 33 of the first developing solution nozzle 300. A developing solution supply pipe 36 is disposed within the cylindrical body 301 so that the through-hole 33 is not opened to the atmosphere.

Figure 4:
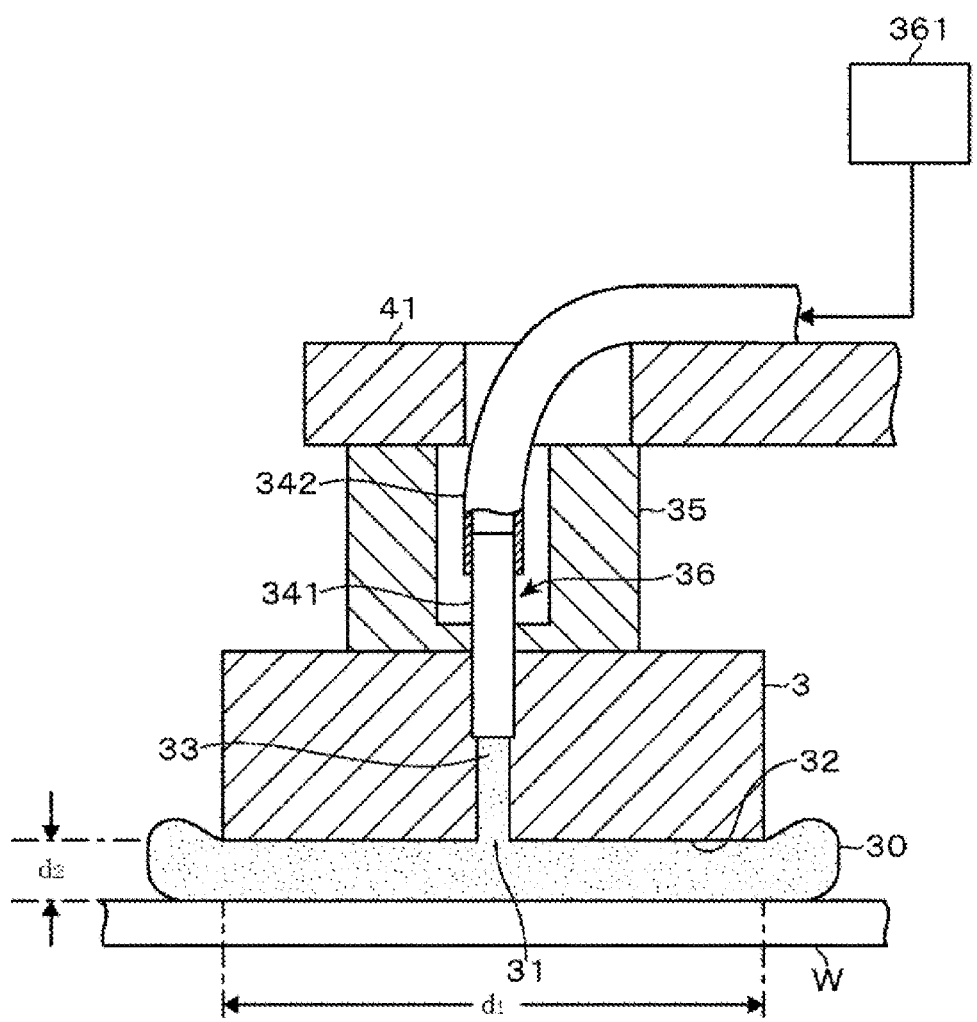
FIG. 4 is a vertical sectional side view of a first developing solution nozzle installed in the developing apparatus.

Other configurations of the first developing solution nozzle 300 are similar to those of the first developing solution nozzle 3 illustrated in FIG. 4. Like components are designated by like reference symbols and the descriptions for like components are omitted. When performing the coating of the developing solution, the developing solution is ejected from the ejection hole 31 and the contact portion 32 is brought into contact with the liquid puddle 30. While rotating the contact portion 32 through the cylindrical body 301 and rotating the wafer W, the first developing solution nozzle 300 is moved from the central portion of the wafer W toward the peripheral edge portion. Since a swirling flow of the developing solution is formed by the rotation of the contact portion 32, the developing solution is well stirred and the concentration uniformity of the developing solution is improved. Thus, the line width uniformity of the pattern becomes good.

Figure 27:
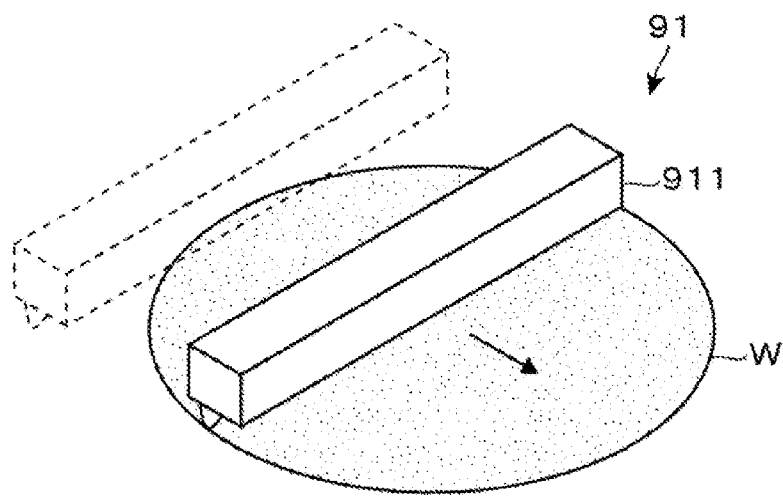
FIG. 27 is a schematic perspective view illustrating another example of the second developing solution nozzle.

Next, other examples of the second developing solution nozzle will be briefly described. A second developing solution nozzle 91 illustrated in FIG. 27 is configured by, for example, forming an ejection hole (not illustrated) on a lower surface of a nozzle body 911, which has a length greater than the diameter of the wafer W, along the longitudinal direction of the nozzle body 911. The ejection hole may be a slit or may include a plurality of discharge openings formed with an interval between the openings along the longitudinal direction of the nozzle body 911. In the second developing solution nozzle 91, the developing solution is supplied on the entire surface of the wafer W by moving the second developing solution nozzle 91 from one end portion of the wafer W toward the other end portion while ejecting the developing solution from the ejection hole.

Figure 28:
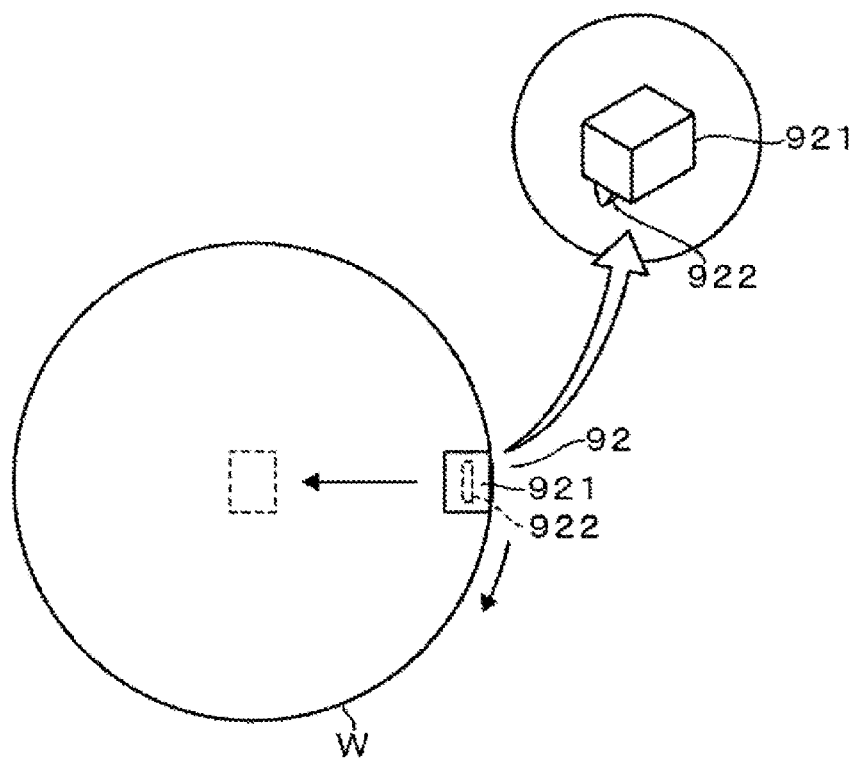
FIG. 28 is a plan view and a schematic perspective view illustrating a further example of the second developing solution nozzle.
Figure 29:
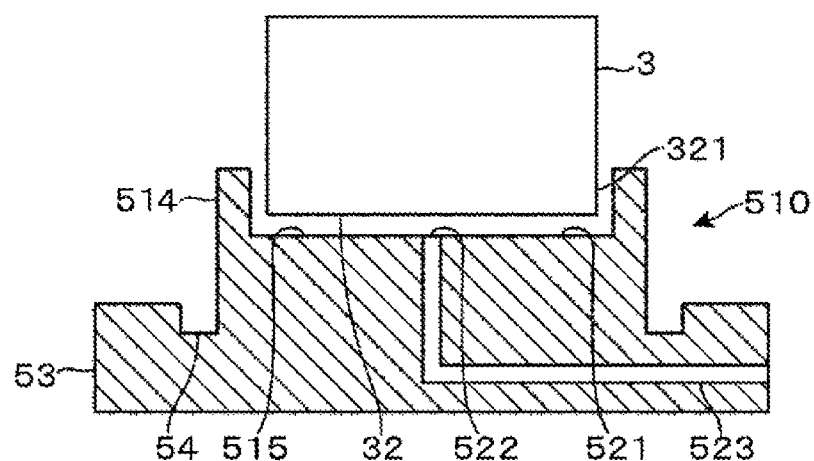
FIG. 29 is a vertical sectional side view illustrating another example of the standby part.

A second developing solution nozzle 92 illustrated in FIG. 28 is configured by forming, for example, a slit-shaped ejection hole 922 on a lower surface of a nozzle body 921 having a length smaller than the diameter of the wafer W. In the second developing solution nozzle 92, the developing solution is supplied on the entire surface of the wafer W by moving the second developing solution nozzle 92 from the peripheral edge portion of the wafer W toward the central portion, while rotating the wafer W and ejecting the developing solution from the ejection hole 922. The developing solution nozzle having the configuration illustrated in FIG. 27 or 28 may be also used as the third developing solution nozzle.

Next, other examples of the standby part will be briefly described with reference to FIGS. 29 to 32. A standby part 510 illustrated in FIG. 29 differs from the aforementioned standby part 5 in that a recess portion 515 having a plan-view shape larger than the contact portion 32 of the first developing solution nozzle 3 is formed on an upper surface of a base portion 514 so that the inner surface of the recess portion 515 serves as a guide surface portion of a cleaning solution. Other configurations and the cleaning method are similar to those of the aforementioned standby part 5. Like components are designated by like reference symbols. In this example, the cleaning solution is supplied to the contact portion 32 of the first developing solution nozzle 3 and the side surface 321 adjacent to the contact portion 32. Thus, not only the contact portion 32 but also the side surface 321 is cleaned.

Figure 30:
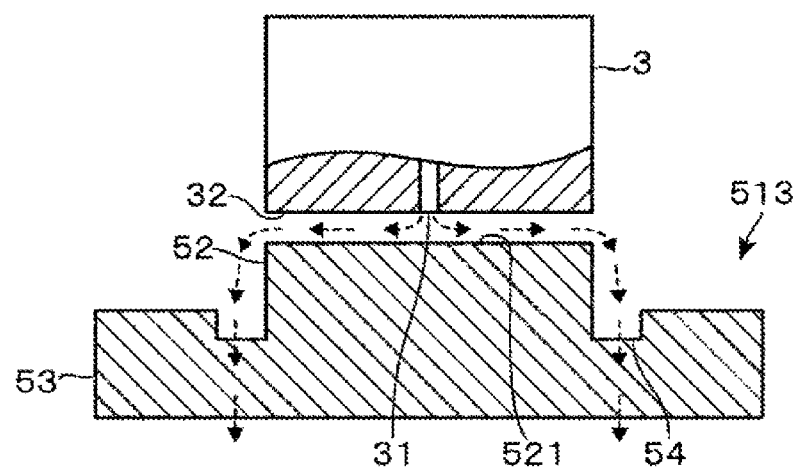
FIG. 30 is a vertical sectional side view illustrating a further example of the standby part.

A standby part 513 illustrated in FIG. 30 differs from the aforementioned standby part 5 in that the cleaning solution is not supplied from the base portion 52 and the developing solution is supplied from the ejection hole 31 of the first developing solution nozzle 3 so as to fill the developing solution (the cleaning solution) between the guide surface portion 521 of the base portion 52 and the contact portion 32, thereby cleaning the contact portion 32 by using the contact with the cleaning solution and the flow of the cleaning solution.

Figure 31:
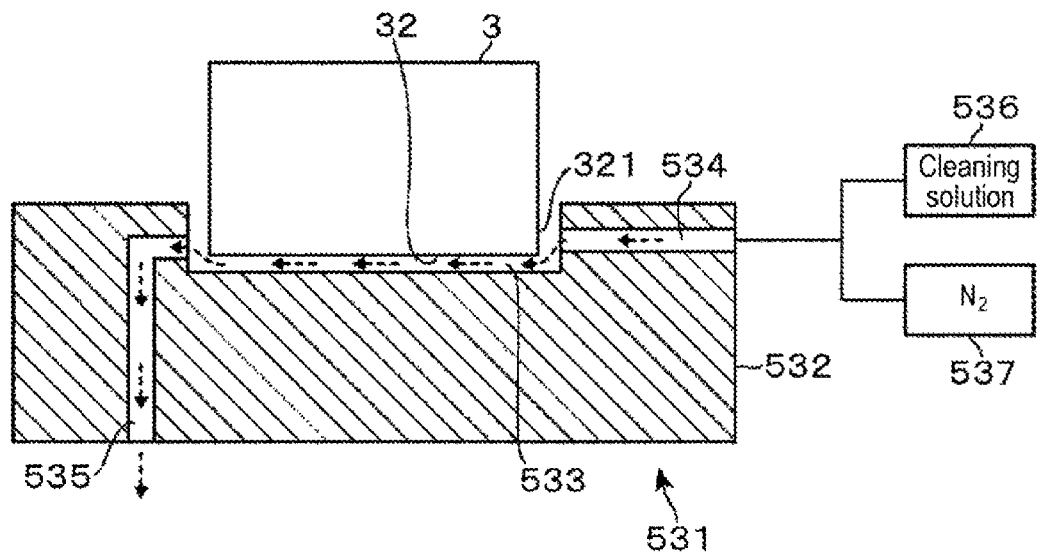
FIGS. 31 and 32 are vertical sectional side views illustrating still further examples of the standby part.

A standby part 531 illustrated in FIG. 31 includes a base portion 532 formed of, e.g., a cylindrical body. A recess portion 533 having a plan-view shape greater than the contact portion 32 of the first developing solution nozzle 3 is formed on the upper surface of the base portion 532. The inner surface of the recess portion 533 is configured to serve as a guide surface portion. In the base portion 532, a supply path 534 is formed which supplies a cleaning solution to the recess portion 533 and a discharge path 535 is formed which discharges the cleaning solution from the recess portion 533. The upstream side of the supply path 534 is connected to a supply source 536 of a cleaning solution and a supply source 537 of a drying gas, e.g., a nitrogen gas. Each of the supply sources 536 and 537 includes a pump, a valve, etc. Each of the supply sources 536 and 537 is configured to supply the cleaning solution or the nitrogen gas to the base portion 532 in response to a control signal transmitted from the controller 200.

In this example, as illustrated in FIG. 31, the first developing solution nozzle 3 is positioned such that the bottom surface of the recess portion 533 opposes the contact portion 32 with a small gap. In this state, the cleaning solution is supplied to the recess portion 533 through the supply path 534. The cleaning solution flows while filling the gap between the recess portion 533 and the contact portion 32 of the first developing solution nozzle 3. Then, the cleaning solution is discharged from the discharge path 535. Since the flow of the cleaning solution is formed within the recess portion 533, the regions of the first developing solution nozzle 3 which make contact with the cleaning solution are cleaned by the contact with the cleaning solution and the flow of the cleaning solution. Subsequently, the supply of the cleaning solution is stopped, for example, in the state in which the first developing solution nozzle 3 is maintained in the same height position. Thereafter, the supply of the nitrogen gas is started. Thus, the gap between the recess portion 533 and the contact portion 32 is dried. In this example, the cleaning solution may be supplied from the ejection hole 31 of the first developing solution nozzle 3 simultaneously with the supply of the cleaning solution from the supply path 534.

Figure 32:
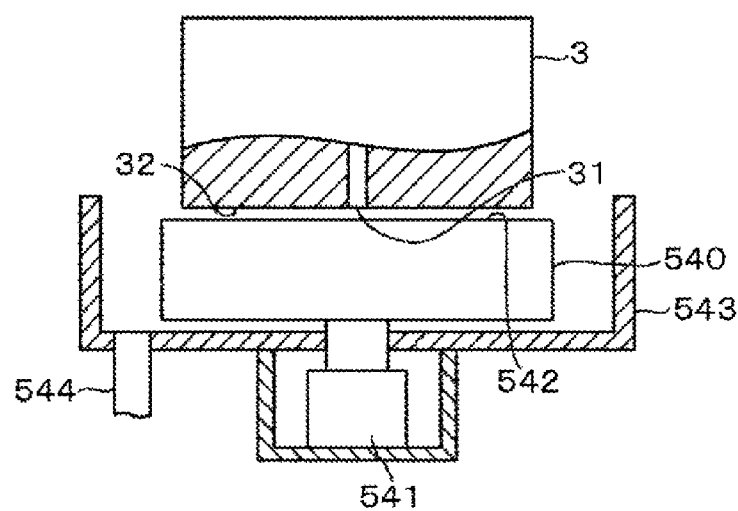

Furthermore, as illustrated in FIG. 32, a base portion 540 may be rotated about a vertical axis by a rotating mechanism 541. In this example, the first developing solution nozzle 3 is positioned such that the contact portion 32 faces the surface (the guide surface portion 542) of the base portion 540 with a small gap left therebetween. A cleaning process is performed by supplying the cleaning solution from the ejection hole 31 of the first developing solution nozzle 3 while rotating the base portion 540. Due to the rotation of the base portion 540, the cleaning solution flows between the guide surface portion 542 of the base portion 540 and the contact portion 32. Thus, the contact portion 32 is cleaned in a more reliable manner. In FIG. 32, reference numeral 543 designates a container which receives the cleaning solution, and reference numeral 544 designates a discharge path of the cleaning solution. Moreover, the base portions illustrated in FIGS. 6 and 29 to 31 may be rotated. In the case where a mechanism for supplying the cleaning solution to the guide surface portion is installed at the side of the standby part, the cleaning solution may not be ejected from the first developing solution nozzle 3 when cleaning the contact portion 32.

Figure 33:
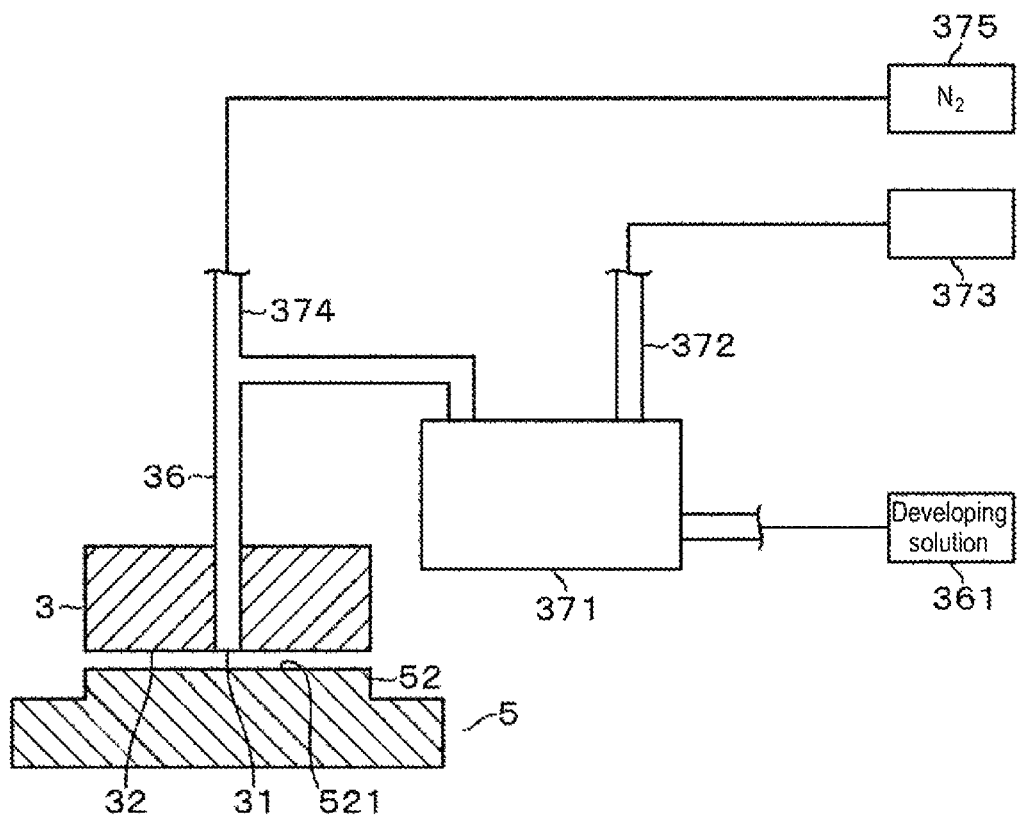
FIG. 33 is a side view illustrating one example of a developing solution supply system of the first developing solution nozzle.

Next, descriptions will be made on an example illustrated in FIG. 33. In this example, a reservoir part which retains a developing solution is installed in the developing solution supply pipe 36 of the first developing solution nozzle 3. In FIG. 33, the first developing solution nozzle 3 and the standby part 5 are schematically illustrated. The developing solution supply pipe 36 is connected to a supply source 361 of a developing solution via a reservoir part 371. A suction mechanism, e.g., a suction pump 373, is connected to the reservoir part 371 via a suction path 372. The developing solution supply pipe 36 is connected to a supply source 375 of a drying gas, e.g., a nitrogen gas, via a branch path 374. For example, when cleaning the first developing solution nozzle 3, a developing solution (a cleaning solution) is supplied from the supply source 361 of the developing solution to the first developing solution nozzle 3 via the reservoir part 371 and the developing solution supply pipe 36, thereby performing the cleaning of the contact portion 32 of the first developing solution nozzle 3 in the aforementioned manner. Subsequently, the supply of the developing solution is stopped after the cleaning process comes to an end. Then, a predetermined amount of developing solution is sucked by the suction pump 373.

Thus, the developing solution existing within the reservoir part 371 flows out toward the suction path 372, whereby the cleaning solution remaining within the first developing solution nozzle 3 is sucked and removed. Subsequently, for example, a predetermined amount of nitrogen gas is supplied from the supply source 375 of the nitrogen gas to the first developing solution nozzle 3, thereby drying the developing solution flow path formed within the first developing solution nozzle 3. After the cleaning process is performed in this way, the developing solution existing within the developing solution flow path of the first developing solution nozzle 3 is removed and then the movement of the first developing solution nozzle 3 is started. Accordingly, when moving the first developing solution nozzle 3, it is possible to prevent the dripping of the developing solution which remains within the first developing solution nozzle 3.

Next, another method of suppressing the dripping of the developing solution from the contact portion 32 will be described with reference to FIGS. 34 to 37.

As described above with reference to FIG. 14, when the first developing solution nozzle 3 waits in the standby part 5, the cleaning of the contact portion 32 is performed by filling the gap between the contact portion 32 and the guide surface portion 521 of the base portion 52 with a cleaning solution (liquid) formed of a developing solution. Moreover, the liquid existing within the gap may not be the developing solution supplied as the cleaning solution from the supply path 523 of the base portion 52. The developing solution remaining within the first developing solution nozzle 3 may flow out and fill the gap.

Figure 34:
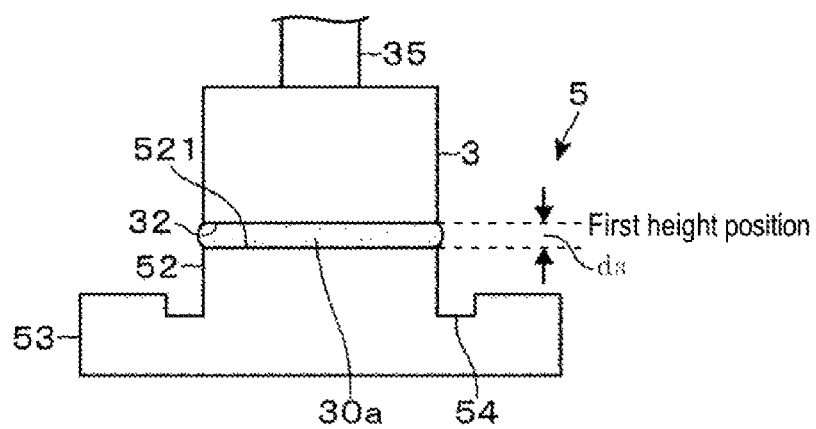
FIG. 34 is a first explanatory view illustrating an operation for suppressing dripping of a cleaning solution from the first developing solution nozzle.

At this time, a liquid puddle 30a of the cleaning solution is formed between the contact portion 32 and the guide surface portion 521 (see FIG. 34). In this state, if the first developing solution nozzle 3 is rapidly moved up by the aforementioned lift mechanism (not illustrated) installed in the first moving mechanism 42 in order to move the first developing solution nozzle 3 to the processing position, some of the cleaning solution which forms the liquid puddle 30a is torn off. As a result, a relatively large amount of cleaning solution adheres to the contact portion 32. If the first developing solution nozzle 3 is moved from the standby part 5 to the processing position in this state, the cleaning solution drips from the contact portion 32. This may be a cause of contaminating other devices and the wafer W.

Figure 35:
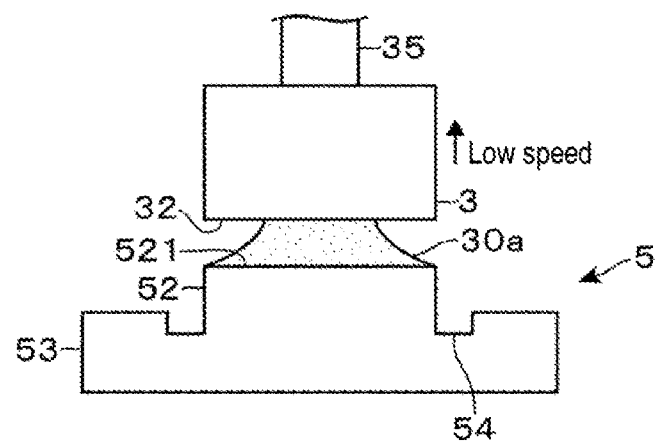
FIG. 35 is a second explanatory view illustrating the operation for suppressing dripping of the cleaning solution.
Figure 36:
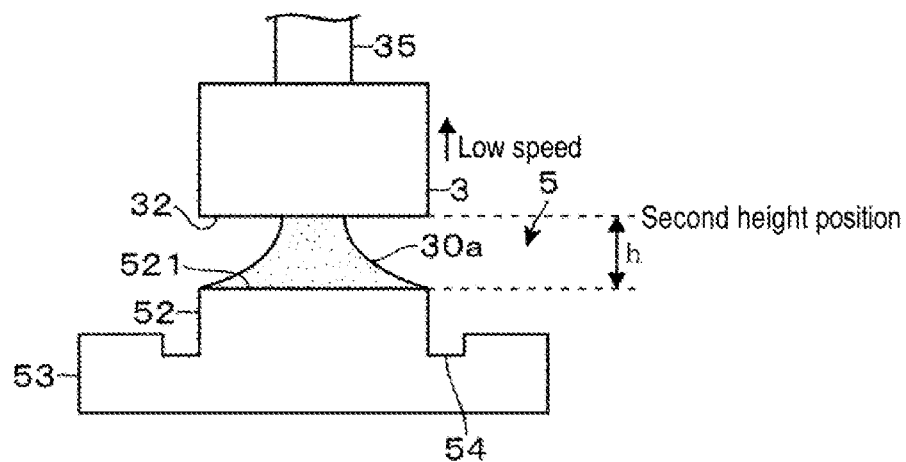
FIG. 36 is a third explanatory view illustrating the operation for suppressing dripping of the cleaning solution.

Thus, in the developing apparatus 1 of this example, when moving the first developing solution nozzle 3 upward from a height position (a first height position: d3=0.5 to 2 mm in the example illustrated in FIG. 14) in which the liquid puddle 30a of the cleaning solution is formed between the first developing solution nozzle 3 and the guide surface portion 521, the first developing solution nozzle 3 is moved up at a relatively low speed (see FIG. 35). In this case, the rising speed of the first developing solution nozzle 3 is adjusted to a first rising speed at which the gravity or the surface tension sufficiently acts on the liquid puddle 30a, thereby suppressing the shearing force acting on the cleaning solution and reducing the amount of a droplet 30b adhering to the guide surface portion 521. The first rising speed is set at, for example, a value which falls within a range greater than 0 mm/sec and not greater than 10 mm/sec, and in some embodiments a value which falls within a range of 1 mm/sec to 5 mm/sec.

Meanwhile, if the entire process of the rising operation of the first developing solution nozzle 3 is executed at such a low speed, the movement time of the first developing solution nozzle 3 is prolonged. This may be a cause of reducing the processing efficiency of the developing apparatus 1. Accordingly, if the first developing solution nozzle 3 reaches a height position (a second height position h) in which the majority of the liquid puddle 30a existing on the guide surface portion 521 is spaced apart from the contact portion 32 (see FIG. 36), the first developing solution nozzle 3 is moved at a second rising speed faster than the first rising speed.

The second height position h is set in a range 2 mm to 10 mm higher than the first height position. In this example, the second height position is set at a height 5 mm higher than the first height position. Furthermore, since the second rising speed is determined by the processing schedule of the wafer W or the like, it is not particularly limited as long as the second rising speed satisfies the requirement that the second rising speed is faster than the first rising speed. In this example, the second rising speed is set at a rising speed which falls within a range of 40 mm/sec to 50 mm/sec.

Figure 37:
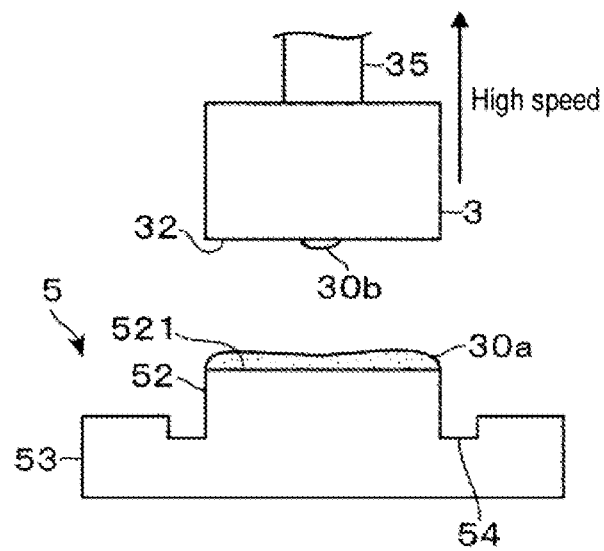
FIG. 37 is a fourth explanatory view illustrating the operation for suppressing dripping of the cleaning solution.

By starting the upward movement of the first developing solution nozzle 3 at a low speed and then switching the movement speed of the first developing solution nozzle 3 to a high speed in this way, it is possible to reduce the amount of the droplet 30b adhering to the contact portion 32 and to suppress the dripping of the cleaning solution from the contact portion 32 (see FIG. 37).

In this regard, a step of moving up the first developing solution nozzle 3 from the first height position to the second height position h at the first rising speed and a step of moving up the first developing solution nozzle 3 at the second rising speed faster than the first rising speed if the first developing solution nozzle 3 reaches the second height position are executed based on the control signals outputted from the controller 200 to the lift mechanism.

Figure 38:
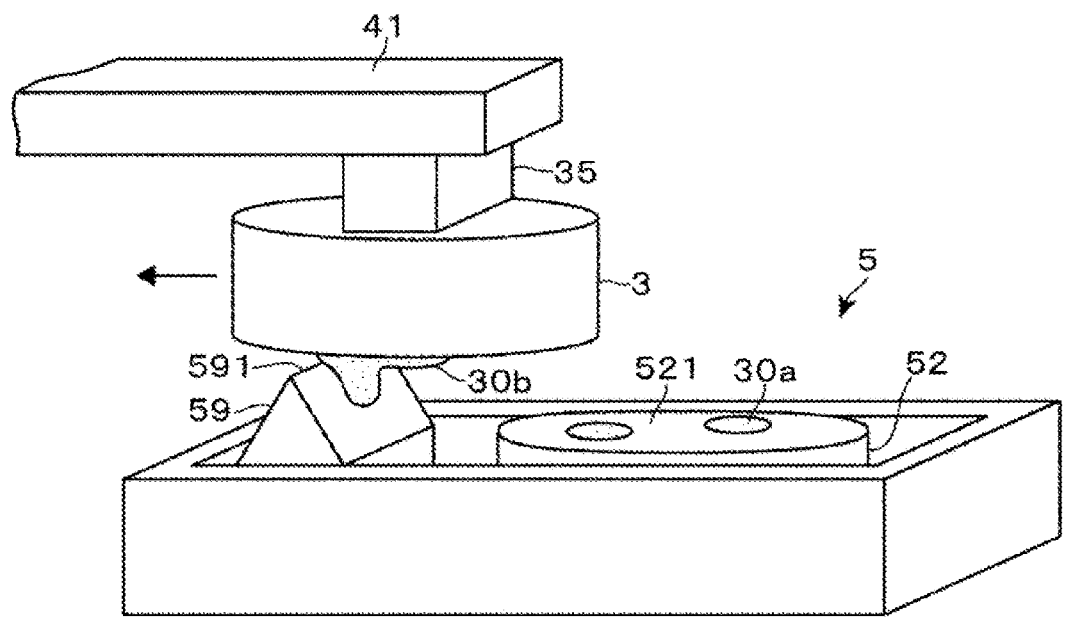
FIG. 38 is a perspective view illustrating a configuration example of a liquid removing portion which removes a droplet adhering to the first developing solution nozzle.

Subsequently, FIGS. 38 to 41 illustrate a method of removing the cleaning solution adhering to the contact portion 32 by using a liquid removing portion 59. As illustrated in FIG. 38, a liquid removing portion 59 for removing the cleaning solution adhered to the contact portion 32 is installed in a position adjacent to the base portion 52 which is the standby position of the first developing solution nozzle 3. For example, the top end of the liquid removing portion 59 has a structure in which a triangular prism is toppled on its side and a sharp ridge section 591 thereof is disposed to face upward. Furthermore, the ridge section 591 is disposed to horizontally extend in the direction which intersects the arrangement direction of the base portion 52 and the liquid removing portion 59. The length dimension of the ridge section 591 is greater than the diameter of the contact portion 32 of the first developing solution nozzle 3.

As described above, the arm 41 which supports the first developing solution nozzle 3 is supported by the first moving mechanism 42 in such a state that the arm 41 can be moved up and down by the lift mechanism (not illustrated). In addition, the arm 41 includes an expansion/contraction mechanism (not illustrated). In this example, a route passing through the upper side of the liquid removing portion 59 is set as a movement route along which the first developing solution nozzle 3 is moved between the standby position and the processing position by using the lift mechanism and the expansion/contraction mechanism of the arm 41. That is, it may be said that the liquid removing portion 59 is installed on the movement route of the first developing solution nozzle 3.

Figure 39:
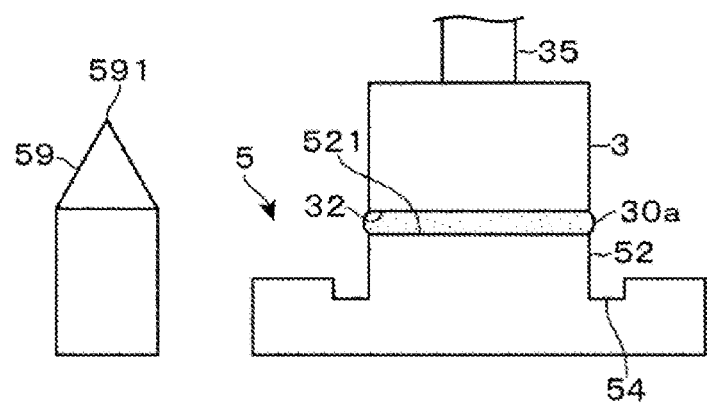
FIG. 39 is a first explanatory view illustrating the action of the liquid removing portion.
Figure 40:
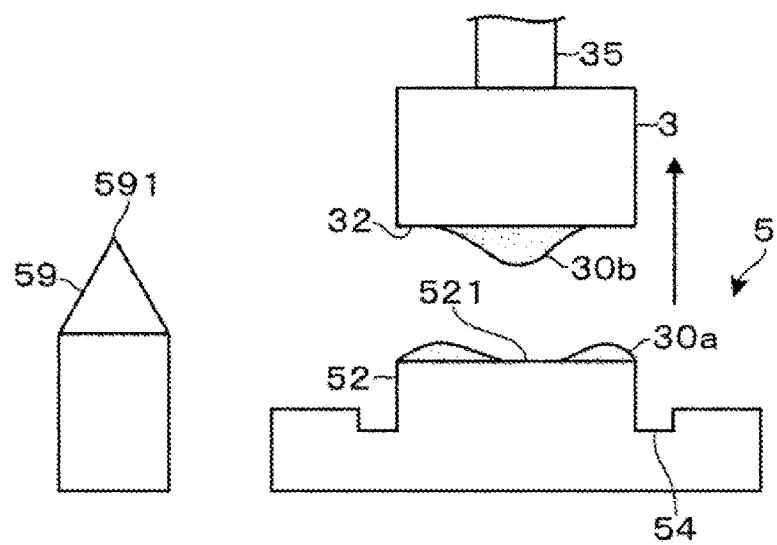
FIG. 40 is a second explanatory view illustrating the action of the liquid removing portion.

In the developing apparatus 1 having the configuration described above, the first developing solution nozzle 3 waits in the state in which the liquid puddle 30a of a liquid such as a cleaning solution or the like is formed between the contact portion 32 and the guide surface portion 521 (see FIG. 39). Subsequently, when moving the first developing solution nozzle 3 to the processing position, the first developing solution nozzle 3 is moved up from the formation position of the liquid puddle 30a to a predetermined height position (see FIG. 40). At this time, the rising speed of the first developing solution nozzle 3 is adjusted to such a rising speed at which some of the liquid forming the liquid puddle 30a is torn off and a relatively large amount of the droplet 30b adheres to the contact portion 32.

Figure 41:
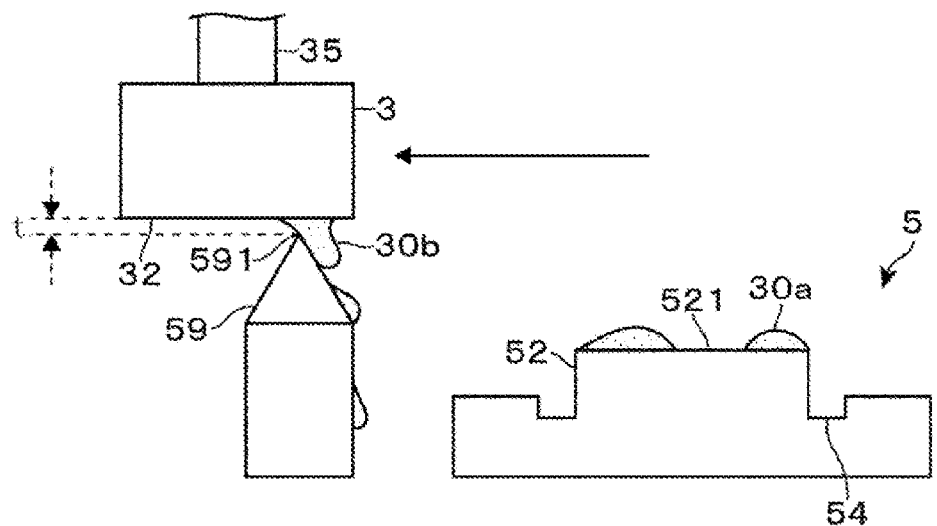
FIG. 41 is a third explanatory view illustrating the action of the liquid removing portion.

As illustrated in FIG. 41, the predetermined height position is set such that the contact portion 32 of the first developing solution nozzle 3 is positioned higher than the ridge section 591 of the liquid removing portion 59 by a gap dimension t [mm].

The gap dimension t is set at a value smaller than the average thickness of the droplet 30b adhered to the contact portion 32. As a result, when the first developing solution nozzle 3 is moved through the upper side of the liquid removing portion 59 as illustrated in FIG. 41, the ridge section 591 of the liquid removing portion 59 makes contact with the droplet 30b. Since the liquid removing portion 59 acts like a scrapper, the droplet 30b is scraped off. By virtue of this operation, the majority of the droplet 30b adhered to the contact portion 32 is removed from the contact portion 32 which passes through the upper side of the liquid removing portion 59. It is therefore possible to suppress the dripping of the liquid from the contact portion 32 when the first developing solution nozzle 3 is moved to the processing position.

Figure 42:
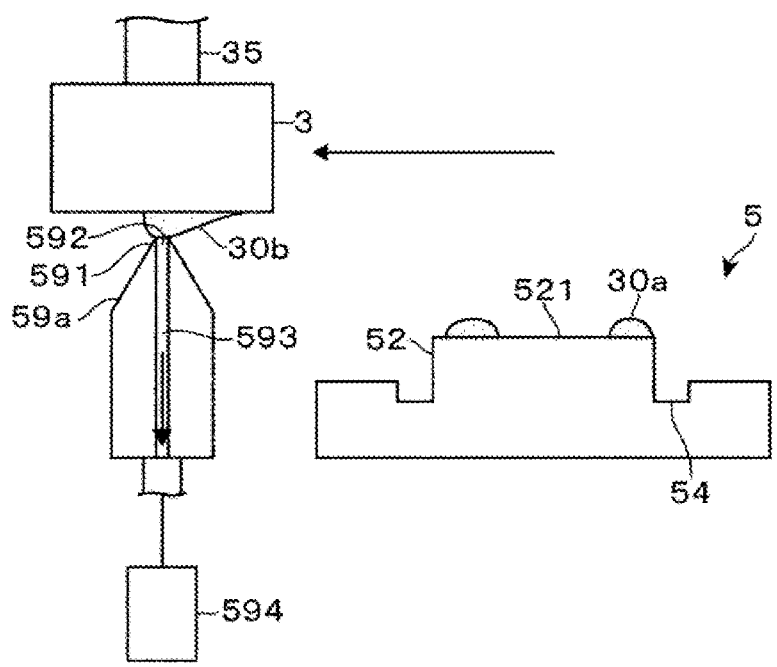
FIG. 42 is a vertical sectional side view illustrating another example of the liquid removing portion.

In this regard, the method of removing the droplet 30b adhered to the contact portion 32 is not limited to the method which scrapes off the droplet 30b by contacting the liquid removing portion 59 as described with reference to FIGS. 38 to 41. For example, as illustrated in FIG. 42, a plurality of suction holes 592 or a linear suction hole 592 may be opened along a ridge section 591 of a liquid removing portion 59a. A droplet 30b may be sucked and removed by a suction pump 594 through a suction path 593 connected to the suction hole(s) 592.

Figure 43:
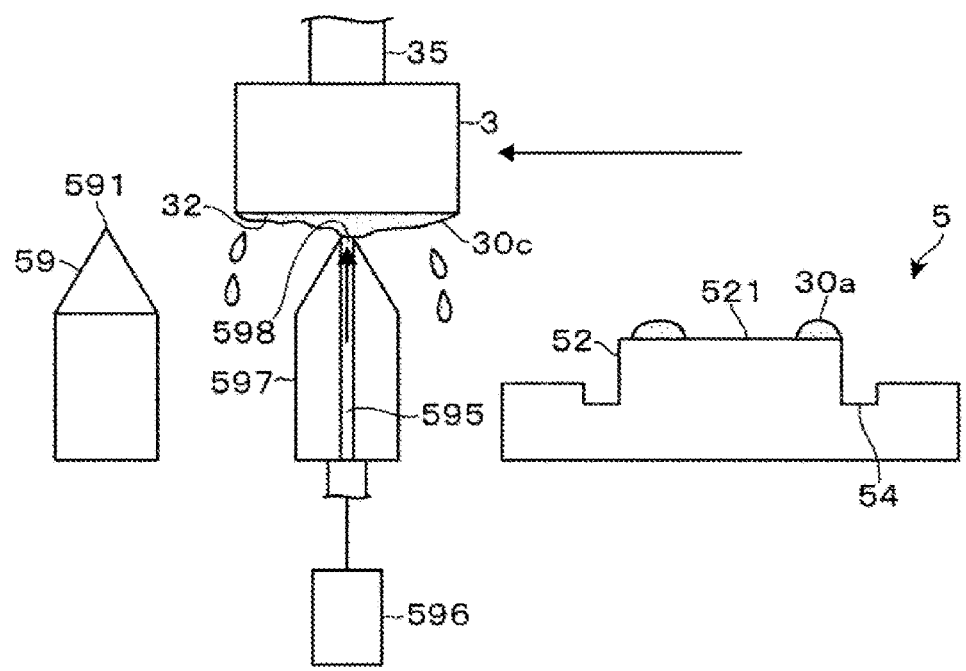
FIG. 43 is a vertical sectional side view illustrating an example in which a cleaning solution supply portion is installed in front of the liquid removing portion.

In the case where the liquid can be forcibly removed using the liquid removing portions 59 and 59a, the cleaning of the contact portion 32 may be performed by installing a cleaning solution supply portion 597 between the standby position (the base portion 52) of the first developing solution nozzle 3 and the liquid removing portion 59 or 59a as illustrated in FIG. 43 (FIG. 43 illustrates an example where the liquid removing portion 59 is installed).

For example, the cleaning solution supply portion 597 has an outward shape similar to that of the liquid removing portion 59a described above. A plurality of ejection holes 598 or a linear ejection hole 598 is opened in the ridge section of the cleaning solution supply portion 597. A cleaning solution supplied from a cleaning solution pump 596 is ejected toward the entire surface of the contact portion 32 through the supply path 595 and the ejection hole(s) 598 (see a cleaning solution 30c in FIG. 43). A developing solution, pure water or the like is used as the cleaning solution.

Figure 44:
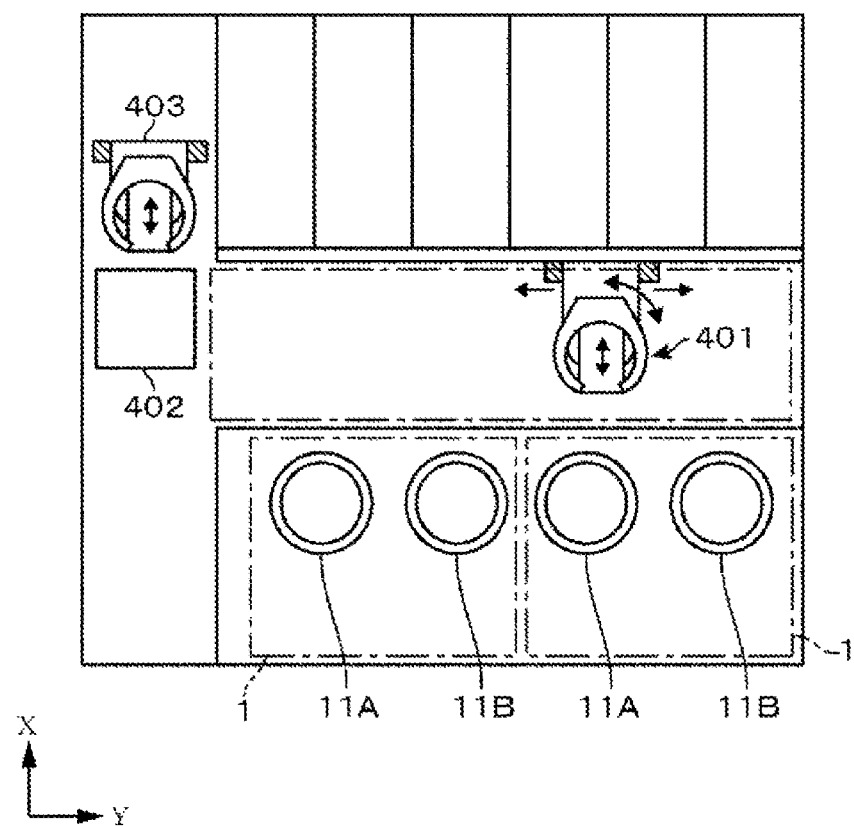
FIG. 44 is a plan view illustrating a processing part of a coating and developing apparatus within which the developing apparatus of the present disclosure is installed.

FIG. 44 is a plan view illustrating one example of a processing part of a coating/developing apparatus within which the developing apparatus 1 of the present disclosure is installed. In FIG. 44, reference numeral 401 designates a substrate transfer mechanism. The substrate transfer mechanism 401 is configured to move along a transfer path extending in the transverse direction (the Y-axis direction). If the longitudinal direction of the transfer path is a left-right direction, two developing apparatuses 1 of the present disclosure are arranged side by side at one side of the transfer path in a front-rear direction. Furthermore, a plurality of modules which performs processes before or after the developing process of the developing apparatuses 1 are installed at the other side of the transfer path in the front-rear direction. In FIG. 44, reference numeral 402 designates a delivery part of a wafer W and reference numeral 403 designates a substrate transfer mechanism.

In the first embodiment and the second embodiment described above, instead of installing the second developing solution nozzle in the second moving mechanism, a cleaning nozzle for supplying a cleaning solution to a surface of a substrate may be installed in the second moving mechanism. Additionally, a gas nozzle may be installed in the second moving mechanism.

In the respective embodiments described thus far, descriptions have been made where the first developing solution nozzle 3 provided with the contact portion 32 for forming the liquid puddle 30 on the surface of the wafer W is disposed within the developing apparatus 1 which performs the developing process of the wafer W. However, in view of the purpose of suppressing the increase in the size of the apparatus, a nozzle having the same structure as the first developing solution nozzle 3 may be installed in a liquid processing apparatus which includes the first and second cup modules 11A and 11B illustrated in FIGS. 1 and 3 and which performs the supply of a different type of processing liquid other than the developing solution. Various kinds of processing liquids may be supplied from the nozzle. Examples of the processing liquids may include a cleaning solution, a rinsing solution, and an etching solution. Even in this liquid processing apparatus, it is possible to suppress the increase in the size of the liquid processing apparatus by employing the various kinds of layouts described above with reference to FIGS. 2 and 17 to 21.

According to the present disclosure, when developing a substrate with a developing solution, the present disclosure uses a developing solution nozzle which forms a liquid puddle on the surface of the substrate by ejecting a developing solution from an ejection hole and spreads the liquid puddle on the substrate by the movement of a contact portion smaller in size than the surface of the substrate and by the rotation of the substrate. Accordingly, the developing solution flows and spreads in a stirred state. Thus, the concentration uniformity of the developing solution becomes good. Consequently, the uniformity of a line width of a pattern within the plane of the substrate is improved.

According to one aspect of the present disclosure, the aforementioned developing solution nozzle is configured to wait in a standby position between first and second cup modules arranged to be spaced apart from each other in a transverse direction. Therefore, the increase in the size of the apparatus is suppressed.

According to another aspect of the present disclosure, a first standby position of a first developing solution nozzle and a second standby position of a second developing solution nozzle are set to overlap with each other in an up-down direction. Therefore, as compared with a case where the first standby position and the second standby position are separately set when seen in a plan view, the installation space may be small. Thus, the increase in the size of the apparatus is suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A developing apparatus which is provided with a cup module including a substrate holding part configured to be rotated by a rotating mechanism and a liquid receiving cup surrounding the substrate holding part, and which performs development by supplying a developing solution to a substrate held on the substrate holding part, the apparatus comprising:
   a first cup module and a second cup module spaced apart from each other in a transverse direction;
   a first developing solution nozzle configured to wait in a standby position between the first cup module and the second cup module; and
   a first moving mechanism configured to move the first developing solution nozzle between the standby position and a processing position in which the developing solution is supplied to the substrate,
   wherein the first developing solution nozzle includes an ejection hole configured to eject the developing solution to form a liquid puddle on a surface of the substrate, the first developing solution nozzle including a contact portion that is smaller than the surface of the substrate and faces the surface of the substrate, and the first developing solution nozzle moves, together with a supply position of the developing solution, from one of a central portion and a peripheral edge portion of a rotating substrate to the other of the central portion and the peripheral edge portion in a state in which the contact portion makes contact with the liquid puddle, whereby the first developing solution nozzle spreads the liquid puddle on the substrate,
   the ejection hole of the first developing solution nozzle is formed to be opened on a lower surface of the contact portion,
   a standby part is installed in the standby position of the first developing solution nozzle, the standby part including a base portion having an upper surface formed as a cleaning solution guide surface portion, and
   the standby part is configured to fill a cleaning solution in a gap between the lower surface of the contact portion and the cleaning solution guide surface portion.

2. The apparatus of claim 1, further comprising:
   one second developing solution nozzle which is exclusively used in the first cup module and is installed in a standby position located at the opposite side of the second cup module when using the first cup module as a reference;
   another second developing solution nozzle which is exclusively used in the second cup module and is installed in a standby position located at the opposite side of the first cup module when using the second cup module as a reference; and one second moving mechanism and another second moving mechanism which respectively move the one second developing solution nozzle and the another second developing solution nozzle between the standby position and the processing position in which the developing solution is supplied to the substrate.

3. The apparatus of claim 2, wherein the one second developing solution nozzle and the another second developing solution nozzle are different from the first developing solution nozzle in terms of structure and developing solution supply method.

4. The apparatus of claim 2, further comprising:
one third developing solution nozzle for exclusive use in the first cup module and another third developing solution nozzle for exclusive use in the second cup module, which are respectively installed in standby positions adjacent to the front sides of the first cup module and the second cup module when an arrangement direction of the first cup module and the second cup module is regarded as a left-right direction; and
one third moving mechanism and another third moving mechanism configured to respectively move the one third developing solution nozzle and the another third developing solution nozzle between the standby positions and processing positions in which the developing solution is supplied to the substrate,
wherein the third developing solution nozzles are different from the first developing solution nozzle in terms of structure and developing solution supply method and use a developing solution differing from the developing solution used in the second developing solution nozzles.

5. The apparatus of claim 1, wherein the first developing solution nozzle includes a developing solution nozzle for exclusive use in the first cup module and a developing solution nozzle for exclusive use in the second cup module.

6. The apparatus of claim 1, wherein the first developing solution nozzle is a developing solution nozzle common to the first cup module and the second cup module.

7. The apparatus of claim 1, wherein a rotation direction of a substrate holding part of the first cup module and a rotation direction of a substrate holding part of the second cup module are set to become opposite to each other when supplying the developing solution to the substrate.

8. The apparatus of claim 1, wherein a receiving part configured to receive the developing solution dropping from the first developing solution nozzle during movement of the first developing solution nozzle is installed between the standby position of the first developing solution nozzle and the inside of a cup of the cup module in which the first developing solution nozzle is used.

9. The apparatus of claim 1, further comprising:
a lift mechanism installed in the first moving mechanism and configured to move the first developing solution nozzle up and down; and
a controller configured to output a control signal to control a lifting operation of the lift mechanism,
wherein the cleaning solution guide surface portion is disposed to face the contact portion of the first developing solution nozzle, and
when, in the course of moving the first developing solution nozzle from the standby position to the processing position, the first developing solution nozzle is moved upward from a first height position for keeping the first developing solution nozzle on standby in a state in which a gap is formed between the contact portion and the cleaning solution guide surface portion and a liquid is filled in the gap, via a second height position set in a range 2 mm to 10 mm higher than the first height position, to a upper side above the second height position, the controller controls the lift mechanism so as to execute a step of moving up the first developing solution nozzle from the first height position to the second height position at a first rising speed which falls within a range greater than 0 mm/sec and not greater than 10 mm/sec and a step of if the first developing solution nozzle reaches the second height position, moving up the first developing solution nozzle at a second rising speed faster than the first rising speed.

10. The apparatus of claim 1, wherein the cleaning solution guide surface portion is disposed to face the contact portion of the first developing solution nozzle,
the first developing solution nozzle is configured to wait in the standby position in a state in which a gap is formed between the contact portion and the cleaning solution guide surface portion and a liquid is filled in the gap, and
a liquid removing portion configured to remove a liquid adhered to the contact portion before the first developing solution nozzle is moved to above the substrate is installed in a movement route of the first developing solution nozzle from the standby position to the processing position.

11. The apparatus of claim 10, wherein the liquid removing portion is disposed below a height position through which the contact portion of the first developing solution nozzle moving toward the processing position passes, and the liquid removing portion sucks and removes the liquid adhered to the contact portion.

12. The apparatus of claim 10, wherein a cleaning solution supply portion, which cleans the contact portion by supplying a cleaning solution to the contact portion of the first developing solution nozzle moving toward the processing position, is installed between the standby position of the first developing solution nozzle and the liquid removing portion.

13. A developing apparatus which is provided with a cup module including a substrate holding part configured to be rotated by a rotating mechanism and a liquid receiving cup surrounding the substrate holding part, and which performs development by supplying a developing solution to a substrate held on the substrate holding part, the apparatus comprising:
a first cup module and a second cup module spaced apart from each other in a transverse direction;
a first developing solution nozzle configured to wait in a first standby position and configured to supply the developing solution onto the substrate;
a second developing solution nozzle configured to wait in a second standby position which overlaps with the first standby position in an up-down direction;
a first moving mechanism configured to move the first developing solution nozzle between the first standby position and a processing position in which the developing solution is supplied to the substrate; and
a second moving mechanism configured to move the second developing solution nozzle between the second standby position and a processing position in which the developing solution is supplied to the substrate,
wherein the first developing solution nozzle includes an ejection hole configured to eject the developing solution to form a liquid puddle on a surface of the substrate, the first developing solution nozzle includes a contact portion formed smaller than the surface of the substrate and installed to oppose the surface of the substrate, and the first developing solution nozzle moves, together with a supply position of the developing solution, from one of a central portion and a peripheral edge portion of a rotating substrate to the other of the central portion and the peripheral edge portion in a state in which the contact portion makes contact with the liquid puddle, whereby the first developing solution nozzle spreads the liquid puddle on the substrate.

14. The apparatus of claim 13, wherein the second developing solution nozzle is different from the first developing solution nozzle in terms of structure and developing solution supply method.

15. The apparatus of claim 13, wherein the second developing solution nozzle includes one second developing solution nozzle installed in one second standby position and exclusively used in the first cup module, and another second developing solution nozzle installed in another second standby position and exclusively used in the second cup module, and the first standby position of the first developing solution nozzle overlaps with at least one of the one second standby position and the another second standby position in the up-down direction.

16. The apparatus of claim 13, wherein the second standby position overlapping with the first standby position in the up-down direction is located at the opposite side of the second cup module when using the first cup module as a reference.

17. The apparatus of claim 13, wherein a cleaning nozzle configured to clean the surface of the substrate is installed in the second moving mechanism.

18. The apparatus of claim 13, wherein instead of the second developing solution nozzle, a cleaning nozzle configured to supply a cleaning solution on the surface of the substrate is installed in the second moving mechanism.

19. The apparatus of claim 13, wherein a gas nozzle configured to inject a gas toward the surface of the substrate is installed in the second moving mechanism.

\* \* \* \* \*